United States Patent
Tanaka

(10) Patent No.: US 11,931,811 B2
(45) Date of Patent: Mar. 19, 2024

(54) COATED CUTTING TOOL

(71) Applicant: TUNGALOY CORPORATION, Fukushima (JP)

(72) Inventor: Shigeki Tanaka, Iwaki (JP)

(73) Assignee: TUNGALOY CORPORATION, Fukushima (JP)

(*) Notice: Subject to any disclaimer, the term of this patent is extended or adjusted under 35 U.S.C. 154(b) by 200 days.

(21) Appl. No.: 17/682,146

(22) Filed: Feb. 28, 2022

(65) Prior Publication Data
US 2022/0297198 A1  Sep. 22, 2022

(30) Foreign Application Priority Data
Mar. 18, 2021  (JP) ................ 2021-044341

(51) Int. Cl.
*C23C 14/06* (2006.01)
*B23B 27/14* (2006.01)
*B23C 5/16* (2006.01)

(52) U.S. Cl.
CPC ............ *B23B 27/148* (2013.01); *B23B 27/14* (2013.01); *B23C 5/16* (2013.01); *C23C 14/0641* (2013.01);
(Continued)

(58) Field of Classification Search
CPC ............ B23B 2224/08; C23C 14/0658; C23C 14/0664; C23C 14/0641; C23C 16/34;
(Continued)

(56) References Cited

U.S. PATENT DOCUMENTS

2010/0215912 A1*  8/2010  Kubota ................. C23C 14/325
428/332
2013/0108850 A1*  5/2013  Kudo ................... C04B 35/5831
428/216
(Continued)

FOREIGN PATENT DOCUMENTS

DE  202020105009 U1 *  3/2021
EP      3 290 137 A1     3/2018
(Continued)

OTHER PUBLICATIONS

Machine translation of JP 2009/028799A.*
(Continued)

*Primary Examiner* — Z. Jim Yang
(74) *Attorney, Agent, or Firm* — Studebaker & Brackett PC

(57) ABSTRACT

A coated cutting tool comprising a substrate containing a cubic boron nitride-containing sintered body, and a coating layer formed on the substrate, wherein the coating layer comprises a lowermost layer and an alternating laminate structure in this order, the lowermost layer comprises $(Al_{1-x}Cr_x)N$, an average thickness of the lowermost layer is 0.01 μm or more and 0.2 μm or less, the alternating laminate structure includes mutually different two kinds of compound layers of a first compound layer containing $(Al_{1-y1}Cr_{y1})N$ and a second compound layer containing $(Al_{1-y2}Cr_{y2})N$ alternately laminated repeatedly twice or more, an average thickness of the entire alternating laminate structure is 0.1 μm or more and 1.2 μm or less, an average thickness of the entire coating layer is 0.2 μm or more and 1.3 μm or less, and a compressive residual stress at the cubic crystal (111) plane is 3.0 GPa or less.

20 Claims, 2 Drawing Sheets

(52) U.S. Cl.
CPC ....... *B23B 2224/24* (2013.01); *B23B 2224/32* (2013.01); *B23B 2226/125* (2013.01); *B23B 2228/105* (2013.01); *B23B 2228/36* (2013.01); *C04B 2235/3865* (2013.01)

(58) Field of Classification Search
CPC ..... C23C 16/347; C23C 16/36; C23C 30/005; C23C 28/04–44; C04B 41/5062; C04B 41/5063
See application file for complete search history.

(56) References Cited

U.S. PATENT DOCUMENTS

| | | | |
|---|---|---|---|
| 2015/0030401 A1* | 1/2015 | Senbokuya | C23C 14/0641 407/119 |
| 2015/0050489 A1* | 2/2015 | Kumar | C23C 14/0641 428/336 |
| 2015/0337459 A1* | 11/2015 | Ahn | C23C 28/042 428/212 |
| 2016/0136735 A1 | 5/2016 | Matsuda et al. | |
| 2017/0173757 A1* | 6/2017 | Sobiech | B24B 37/24 |
| 2018/0044773 A1* | 2/2018 | Eriksson | C23C 14/0641 |
| 2018/0117680 A1 | 5/2018 | Tanaka | |
| 2019/0111495 A1* | 4/2019 | Maekawa | C23C 14/0641 |
| 2020/0080187 A1 | 3/2020 | Katagiri | |
| 2021/0292885 A1* | 9/2021 | Wang | C23C 14/325 |
| 2022/0143711 A1* | 5/2022 | Isaka | C23C 14/0641 |
| 2022/0226907 A1* | 7/2022 | Setoyama | C22C 1/05 |
| 2022/0331879 A1* | 10/2022 | Kohlscheen | C23C 28/42 |

FOREIGN PATENT DOCUMENTS

| | | | |
|---|---|---|---|
| EP | 3 346 026 A1 | | 7/2018 |
| JP | 2009028799 A | * | 2/2009 |
| JP | 2009101474 A | * | 5/2009 |
| JP | 2014-087914 A | | 5/2014 |
| JP | 2014-159072 A | | 9/2014 |
| JP | 2015-208807 A | | 11/2015 |
| JP | 2016165788 A | * | 9/2016 |
| JP | 2020199589 A | * | 12/2020 |
| WO | 2016/175166 A1 | | 11/2016 |

OTHER PUBLICATIONS

Machine translation of JP 2009/101474A.*
Machine translation of JP 2016/165788A.*
Machine translation of JP 2020/199589A.*
Machine translation of DE 202020105009 U1.*

* cited by examiner

COATED CUTTING TOOL

BACKGROUND OF THE INVENTION

Field of the Invention

The present invention relates to a coated cutting tool.

Description of Related Art

For cutting machining of a sintered metal, a cutting tool containing a cemented carbide, ceramic, or a cubic boron nitride (which will be hereinafter also described as "cBN") sintered body is often used. Particularly, when a sintered metal having such a hardness as to be more than 60 HRC is subjected to cutting machining at a high speed, a cutting tool containing a cBN sintered body is often selected except for some ceramic tools. This is because the cBN sintered body is more excellent in chemical stability and mechanical characteristics under high temperatures of 1,000° C. or more than a cemented carbide. A coated cBN sintered body tool including one or two or more coating layers of a TiCN layer, a TiAlN layer, an AlCrN layer, or the like on the surface of the cBN sintered body has been widely used for uses of high-speed continuous cutting machining of a sintered metal because of its excellent wear resistance.

For example, Patent Publication JP-A-2015-208807 proposes as follows: the surface of the cBN sintered body optimized in particle size distribution of cBN particles is coated with two layers of both an AlCrN layer and a TiAlN layer sequentially from the substrate side; this results in an increase in substrate adhesive force of the coating layer; as a result, abnormal peeling during machining, and abnormal wear caused by this are suppressed.

SUMMARY

Technical Problem

With strong intermittent machining of a sintered metal, other than the wear caused by peeling of a coating layer, chipping of the blade edge at the incision boundary part may occur. An increase in adhesive force between the coating layer and the substrate suppresses chipping starting from peeling of the coating layer. However, in order to suppress chipping caused by the impact between the tool blade edge and the work material in strong intermittent machining, it is necessary to optimize not only the adhesive force between the coating layer and the substrate but also the configuration of the coating layer. With the technology described in Patent Publication JP-A-2015-208807, the provision of the TiAlN layer on the AlCrN adhesion layer simultaneously improves the adhesive force between the coating layer and the substrate, and the wear resistance. Although this is described, the focus is not placed on the chipping resistance. In strong intermittent machining of a sintered metal, it is important to achieve a balance between the chipping resistance and the wear resistance. While the TiAlN layer is excellent in wear resistance, it may have insufficient fracture resistance. Further, for example, for a cutting tool having such a coating layer with a thickness of more than 1.4 μm as shown in Patent Publication JP-A-2015-208807, the following is often caused: the cutting tool cannot withstand the machining strength, so that the blade edge is largely broken at the initial stage of machining.

The present invention has been made in light of the above circumstances, and an object of the present invention is to provide a coated cutting tool which has excellent wear resistance and fracture resistance and which accordingly allows for an extended tool life.

Solution to Problem

The present inventor has conducted studies regarding extending the tool life of a coated cutting tool from the above-described perspective and has then found the following: coated cutting tool with a specific configuration is enable both wear resistance and fracture resistance to be improved, and, as a result, the tool life of the coated cutting tool can be extended, and this has led to the completion of the present invention.

Namely, the present invention is as set forth below.

[1] A coated cutting tool comprising a substrate containing a cubic boron nitride-containing sintered body, and a coating layer formed on the substrate,
  wherein the coating layer comprises a lowermost layer and an alternating laminate structure in this order from the substrate side toward a surface side of the coating layer,
  the lowermost layer contains a compound having a composition represented by the following formula (1), $$(Al_{1-x}Cr_x)N \qquad (1)$$

[where in the formula (1), x represents an atomic ratio of a Cr element relative to a total ratio of an Al element and the Cr element, and satisfies $0.20 \leq x \leq 0.50$],
  an average thickness of the lowermost layer is 0.01 μm or more and 0.2 μm or less,
  the alternating laminate structure is an alternating laminate structure including a first compound layer containing a compound having a composition represented by the following formula (2) and a second compound layer containing a compound having a composition represented by the following formula (3) alternately laminated repeatedly twice or more, $$(Al_{1-y1}Cr_{y1})N \qquad (2)$$

[where in the formula (2), y1 represents an atomic ratio of a Cr element relative to a total ratio of an Al element and the Cr element, and satisfies $0.10 \leq y1 \leq 0.60$], $$(Al_{1-y2}Cr_{y2})N \qquad (3)$$

[where in the formula (3), y2 represents an atomic ratio of a Cr element relative to a total ratio of an Al element and the Cr element, and satisfies $0.10 \leq y2 \leq 0.60$],
  in the alternating laminate structure, the first compound layer and the second compound layer are two kinds of compound layers having mutually different atomic ratios y1 and y2,
  an average thickness of the entire alternating laminate structure is 0.1 μm or more and 1.2 μm or less,
  an average thickness of the entire coating layer is 0.2 μm or more and 1.3 μm or less, and
  the coating layer comprises a crystal of a cubic system, and a compressive residual stress at the cubic crystal (111) plane is 3.0 GPa or less.

[2] The coated cutting tool according to [1], wherein an average thickness per layer of the first compound layer is 1 nm or more and 100 nm or less, and
  an average thickness per layer of the second compound layer is 1 nm or more and 100 nm or less.

[3] The coated cutting tool according to [1] or [2], wherein the coating layer comprises a crystal of a cubic system, and a compressive residual stress at the cubic crystal (220) plane is 2.0 GPa or less.

[4] The coated cutting tool according to any one of [1] to [3], wherein the coated cutting tool comprises a rake face, a flank, and a cross ridgeline part between the rake face and the flank, and the coating layer comprises a crystal of a cubic system, and an absolute value |σ11−σ22| of a difference between a compressive residual stress σ11 at a cubic crystal (111) plane of the coating layer in a direction in parallel with the cross ridgeline part and a compressive residual stress σ22 at a cubic crystal (111) plane of the coating layer in a direction perpendicular to the cross ridgeline part is less than 0.5 GPa.

[5] The coated cutting tool according to [4], wherein the σ11 is 0.0 GPa or more and 3.0 GPa or less.

[6] The coated cutting tool according to [4] or [5], wherein the σ22 is 0.0 GPa or more and 3.0 GPa or less.

[7] The coated cutting tool according to any one of [1] to [6], wherein the coating layer comprises a crystal of a cubic system, and a value of I(111)/I(220) is 2.5 or more where I(111) and I(220) represent X-ray diffraction intensities at the cubic crystal (111) plane and the cubic crystal (220) plane, respectively.

[8] The coated cutting tool according to any one of [1] to [7], wherein the coating layer has an upper layer on a surface opposite to the substrate of the alternating laminate structure, the upper layer contains a compound containing at least one element selected from the group consisting of Ti, Zr, Hf, V, Nb, Ta, Cr, Mo, W, Al, Si, and Y, and at least one element selected from the group consisting of C, N, O, and B, an average thickness of the upper layer is 0.02 μm or more and 0.3 μm or less, and a ratio of an average thickness of the upper layer occupying an average thickness of the entire coating layer is 25% or less.

[9] The coated cutting tool according to any one of [1] to [8], wherein the cubic boron nitride-containing sintered body comprises a cubic boron nitride in an amount of 55 vol % or more and 75 vol % or less, and a binder phase in an amount of 25 vol % or more and 45 vol % or less, for every 100 vol % of the total amount, and the cubic boron nitride is a particle, and an average particle diameter of the particle is 0.5 μm or more and 2.0 μm or less.

Advantageous Effects of Invention

The present invention can provide a coated cutting tool which has excellent wear resistance and fracture resistance and which accordingly allows for an extended tool life.

DESCRIPTION OF EMBODIMENTS

Figure 1:
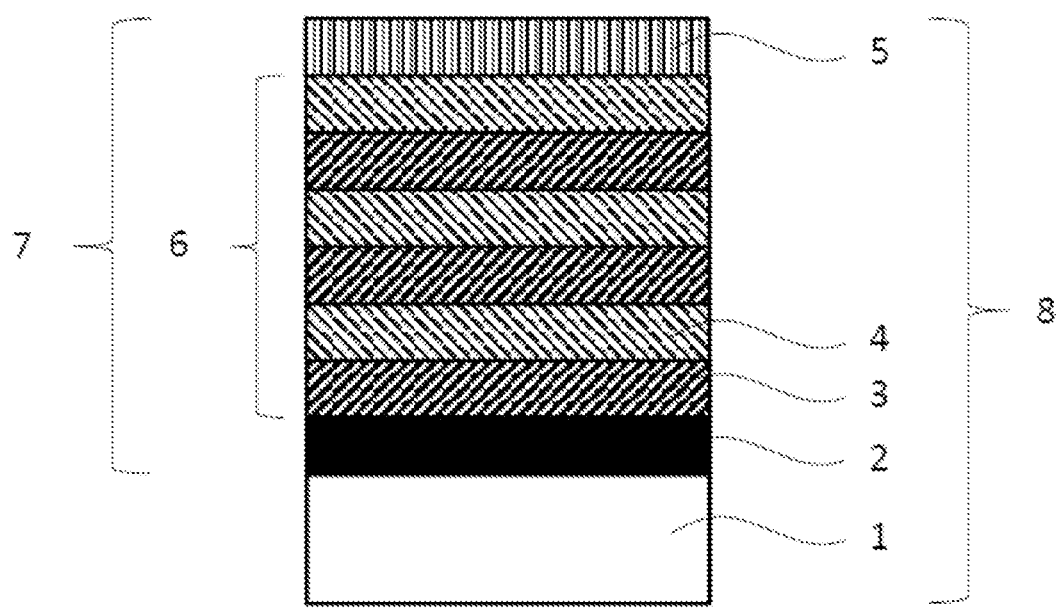
FIG. 1 is a schematic view showing an example of a coated cutting tool of the present invention.

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. In the drawings, unless otherwise specified, positional relationships, such as vertical and horizontal relationships, are based on the positional relationships shown in the drawings. Further, the dimensional ratios of the drawings are not limited to those shown therein.

A coated cutting tool of the present embodiment comprises a substrate containing a cubic boron nitride-containing sintered body, and a coating layer formed on the substrate. The coating layer includes a lowermost layer and an alternating laminate structure in this order from the substrate side toward a surface side of the coating layer. The lowermost layer contains a compound having a composition represented by the following formula (1).

$$(Al_{1-x}Cr_x)N \quad (1)$$

[where in the formula (1), x represents an atomic ratio of a Cr element relative to the total ratio of an Al element and the Cr element, and satisfies 0.20≤x≤0.50]

The average thickness of the lowermost layer is 0.01 μm or more and 0.2 μm or less. The alternating laminate structure is an alternating laminate structure including a first compound layer containing a compound having a composition represented by the following formula (2), and a second compound layer containing a compound having a composition represented by the following formula (3) alternately laminated repeatedly twice or more therein.

$$(Al_{1-y1}Cr_{y1})N \quad (2)$$

[where in the formula (2), y1 represents an atomic ratio of a Cr element relative to the total ratio of an Al element and the Cr element, and satisfies 0.10≤y1≤0.60], $$(Al_{1-y2}Cr_{y2})N \quad (3)$$

[where in the formula (3), y2 represents an atomic ratio of a Cr element relative to the total ratio of an Al element and the Cr element, and satisfies 0.10≤y2≤0.60].

In the alternating laminate structure, the first compound layer and the second compound layer are two kinds of compound layers having mutually different atomic ratios y1 and y2. The average thickness of the entire alternating laminate structure is 0.1 μm or more and 1.2 μm or less, and the average thickness of the entire coating layer is 0.2 μm or more and 1.3 μm or less. The coating layer comprises a crystal of a cubic system, and the compressive residual stress at the cubic crystal (111) plane is 3.0 GPa or less.

The factor for allowing such a coated cutting tool to be improved in wear resistance and fracture resistance, and to have a long tool life is not particularly apparent, and the present inventors consider the factor as follows. However, the factor is not limited thereto. Namely, the coated cutting tool of the present embodiment is excellent in wear resistance and fracture resistance in, for example, machining of a quenched steel or a heat resistant alloy because the substrate comprises a cubic boron nitride-containing sintered body. Further, when the average thickness of the entire coating layer is 0.2 μm or more and 1.3 μm or less, sufficient fracture resistance can be ensured. Further, when the coating layer includes a lowermost layer and an alternating laminate structure in this order from the substrate side toward the surface side of the coating layer, and x in the composition $(Al_{1-x}Cr_x)N$ represented by the formula (1) of the lowermost layer is 0.2 or more, it is possible to suppress the occurrence of the reduction of the mechanical characteristics and embrittlement. This improves the chipping resistance, and advantageously works for the improvement of the adhesive force between the substrate containing a cubic boron nitride-containing sintered body and the coating layer. On the other hand, when x in the composition $(Al_{1-x}Cr_x)N$ represented by the formula (1) of the lowermost layer is 0.5 or less, the (111) plane is more intensely oriented than the (220) plane at the lowermost layer. This advantageously works for the improvement of the adhesive force between the substrate containing a cubic boron nitride-containing sintered body and the coating layer. Further, when the average thickness of the lowermost layer is 0.01 µm or more and 0.2 µm or less, it is possible to ensure the adhesive force without impairing the fracture resistance of the coating layer. Further, the coating layer has the alternating laminate structure of AlCrN including the first compound layer and the second compound layer alternately laminated repeatedly twice or more therein. As a result, more excellent fracture resistance (chipping resistance) than that of the monolayered structure of AlCrN is exhibited. Furthermore, when the average thickness of the entire alternating laminate structure is 0.1 µm or more, the wear resistance is improved. In the case of 1.2 µm or less, the fracture resistance is improved, so that the coated cutting tool can withstand the strong intermittent machining strength of a sintered metal. Still further, when y1 in the composition $(Al_{1-y1}Cr_{y1})N$ represented by the formula (2) of the first compound layer is 0.1 or more, the chemical stability under high temperatures of the alternating laminate structure part is improved. This can prevent the embrittlement of the coating layer during cutting machining, which contributes to the improvement of the fracture resistance of the entire coating layer. On the other hand, when y1 is 0.6 or less, the high temperature hardness and the heat resistance due to containing Al are improved. For this reason, the wear resistance of the coated cutting tool is improved. Further, when y2 in the composition $(Al_{1-y2}Cr_{y2})N$ represented by the formula (3) of the second compound layer is 0.1 or more, the chemical stability under high temperatures of the alternating laminate structure part is improved. As a result, it is possible to prevent the embrittlement of the coating layer during cutting machining. This contributes to the improvement of the fracture resistance of the entire coating layer. On the other hand, when y1 is 0.6 or less, the high temperature hardness and the heat resistance due to containing Al are improved, and hence, the wear resistance of the coated cutting tool is improved. Further, when the compressive residual stress at the cubic crystal (111) plane of the coating layer is 3.0 GPa or less, the adhesive force of the coating layer is improved. This can reduce the occurrence risk of the abnormal damage triggered by the strain of the stress in the coating layer. The combination of the effects results in the coated cutting tool of the present embodiment improved in wear resistance and fracture resistance and having a long tool life.

The coated cutting tool of the present embodiment comprises a substrate containing a cubic boron nitride-containing sintered body, and a coating layer formed on the surface of the substrate. The coated cutting tool of the present embodiment is excellent in wear resistance and fracture resistance in machining of a quenched steel or a heat resistant alloy because the substrate comprises a cubic boron nitride-containing sintered body.

In the coated cutting tool of the present embodiment, the cubic boron nitride-containing sintered body preferably contains a cubic boron nitride in an amount of 55 vol % or more and 75 vol % or less, and a binder phase in an amount of 25 vol % or more and 45 vol % or less for every 100 vol % of the total amount. The coated cutting tool of the present embodiment tends to be improved in fracture resistance when the cubic boron nitride-containing sintered body contains a cubic boron nitride in an amount of 55 vol % or more, and a binder phase in an amount of 45 vol % or less. On the other hand, the coated cutting tool of the present embodiment tends to be improved in wear resistance when the cubic boron nitride-containing sintered body contains a cubic boron nitride in an amount of 75 vol % or less, and a binder phase in an amount of 25 vol % or more. From the same viewpoint, the cubic boron nitride-containing sintered body more preferably contains a cubic boron nitride in an amount of 57 vol % or more and 73 vol % or less, and a binder phase in an amount of 27 vol % or more and 43 vol % or less, and further preferably contains a cubic boron nitride in an amount of 60 vol % or more and 70 vol % or less, and a binder phase in an amount of 30 vol % or more and 40 vol % or less for every 100 vol % of the total amount.

Incidentally, in the present embodiment, the contents (vol %) of the cubic boron nitride and the binder phase can be determined by, for example, analysis with commercially available image analysis software from the structure photograph of the cubic boron nitride-containing sintered body photographed by a scanning electron microscope (SEM). More specifically, for example, the contents can be determined in the following manner. First, the surface or a given cross section of the cubic boron nitride-containing sintered body is subjected to mirror polishing, and the backscattered electron image of the polished surface of the cubic boron nitride-containing sintered body is observed using a SEM. The polished surface of the cubic boron nitride-containing sintered body is observed in a form of backscattered electron image enlarged at a magnification of 5,000 to 20,000 times using a SEM. It can be identified using an energy dispersive X-ray spectrometer (EDS) included with the SEM that the black region in the backscattered electron image of the polished surface is a cubic boron nitride, and regions other than the black region are binder phases. Subsequently, the structure photograph is photographed using a SEM. Using commercially available image analysis software, respective occupying areas of the cubic boron nitride and the binder phase are determined from the resulting structure photograph. The values are referred to as the contents (vol %) of the cubic boron nitride and the binder phase.

In the coated cutting tool of the present embodiment, preferably, the cubic boron nitride is a particle, and the average particle diameter of the particles is 0.5 µm or more and 2.0 µm or less. For the coated cutting tool of the present embodiment, when the average particle size of the particle of the cubic boron nitride is 0.5 µm or more, the thermal conductivity is improved, which can suppress the reaction wear. As a result, it is possible to suppress the reduction of the strength of the cutting blade. For this reason, the fracture resistance tends to be more improved. On the other hand, in the coated cutting tool of the present embodiment, when the average particle diameter of the particles of the cubic boron nitride is 2.0 µm or less, the thickness of the binder phase becomes uniform. For this reason, the strength of the cubic boron nitride-containing sintered body is improved. From the same viewpoint, the average particle diameter of the particles of the cubic boron nitride is more preferably 0.6 µm or more and 1.8 µm or less, and further preferably 0.8 µm or more and 1.5 µm or less.

Incidentally, in the present embodiment, the average particle diameter of the particles of the cubic boron nitride can be determined by, for example, analysis by commercially available image analysis software from the structure photograph of the cubic boron nitride-containing sintered body photography by a SEM. More specifically, the average particle diameter can be determined, for example, in the following manner. First, the surface or a given cross section of the cubic boron nitride-containing sintered body is subjected to mirror polishing, and the backscattered electron image of the polished surface of the cubic boron nitride-containing sintered body is observed using a SEM. The structure photograph of the cubic boron nitride-containing sintered body enlarged at a magnification of 5,000 to 20,000 times is photographed using a SEM. The value obtained from analysis according to ASTM E 112-96 using commercially available image analysis software of the structure photograph of the cubic boron nitride-containing sintered body photographed is referred to as the particle diameter of the particle of the cubic boron nitride present in the cross-sectional structure. In three visual fields, the structure photograph of the cubic boron nitride-containing sintered body is photographed, each particle diameter of the cubic boron nitride present in the cross sectional structure is determined. The average value (arithmetical mean) thereof is referred to as the average particle diameter of the particle of the cubic boron nitride.

In the coated cutting tool of the present embodiment, the binder phase preferably contains at least one metal element selected from the group consisting of Ti (titanium), Zr (zirconium), Hf (hafnium), V (vanadium), Nb (niobium), Ta (tantalum), Cr (chromium), Mo (molybdenum), W (tungsten), Al (aluminum), and Co (cobalt). Alternatively, the binder phase preferably contains a compound containing at least one metal element selected from the group consisting of Ti, Zr, Hf, V, Nb, Ta, Cr, Mo, W, Al, and Co, and at least one element selected from the group consisting of C (carbon), N (nitrogen), O (oxygen), and B (boron). Specifically, although not particularly limited, examples thereof may include $Al_2O_3$, TiN, TiC, TiCN, $TiB_2$, AlN, $AlB_2$, WC, $ZrO_2$, ZrO, ZrN, $ZrB_2$, WB, $W_2B$, CoWB, $WCo_{21}B_6$, $Co_3W_3C$, and $Co_4W_2C$. Out of these, $Al_2O_3$, AlN, and TiN are preferable. The coated cutting tool of the present embodiment tends to be more excellent in balance between the wear resistance and the fracture resistance when the binder phase comprises such a compound.

Further, for the coated cutting tool of the present embodiment, when the binder phase contains two or more compounds, the content ratio of each compound in the binder phase is not particularly limited. For example, when the binder phase contains an Al compound and a Ti compound, the content ratio of the Al compound in the binder phase is preferably 3.0 to 15.0 vol %, more preferably 4.0 to 14.0 vol %, and further preferably 5.0 to 13.5 vol %. Whereas, the content ratio of the Ti compound in the binder phase is preferably 15.0 to 38.0 vol %, more preferably 16.0 to 37.0 vol %, and further preferably 17.5 to 36.0 vol %.

For the coated cutting tool of the present embodiment, the average thickness of the entire coating layer is 0.2 μm or more and 1.3 μm or less. For the coated cutting tool of the present embodiment, when the average thickness of the entire coating layer is 0.2 μm or more and 1.3 μm or less, it is possible to ensure a sufficient fracture resistance. From the same viewpoint, the average thickness of the entire coating layer is preferably 0.25 μm or more and 1.25 μm or less, and more preferably 0.3 μm or more and 1.2 μm or less.

Lowermost Layer

For the coated cutting tool of the present embodiment, the coating layer includes a lowermost layer and an alternating laminate structure in this order from the substrate side toward the surface side of the coating layer.

The lowermost layer contains a compound having the composition represented by the following formula (1), $$(Al_{1-x}Cr_x)N \qquad (1)$$

[where in the formula (1), x represents the atomic ratio of the Cr element relative to the total atomic ratio of the Al element and the Cr element, and satisfies 0.20≤x≤0.50].

For the coated cutting tool of the present embodiment, when x in the composition $(Al_{1-x}Cr_x)N$ represented by the formula (1) of the lowermost layer is 0.2 or more, it is possible to suppress the occurrence of the reduction of the mechanical characteristics and the embrittlement. This improves the chipping resistance, and advantageously works for the improvement of the adhesive force between the substrate containing a cubic boron nitride-containing sintered body and the coating layer. On the other hand, for the coated cutting tool of the embodiment, when x in the composition $(Al_{1-x}Cr_x)N$ represented by the formula (1) of the lowermost layer is 0.5 or less, the (111) plane is more intensely oriented than the (220) plane at the lowermost layer. This advantageously works for the improvement of the adhesive force between the substrate containing a cubic boron nitride-containing sintered body and the coating layer. From the same viewpoint, x in the composition $(Al_{1-x}Cr_x)N$ represented by the formula (1) of the lowermost layer is preferably 0.22 or more and 0.45 or less, and more preferably 0.25 or more and 0.4 or less.

For the coated cutting tool of the present embodiment, the average thickness of the lowermost layer is 0.01 μm or more and 0.2 μm or less. For the coated cutting tool of the present embodiment, when the average thickness of the lowermost layer is 0.01 μm or more and 0.2 μm or less, it is possible to ensure the adhesive force without impairing the fracture resistance of the coating layer. From the same viewpoint, the average thickness of the lowermost layer is preferably 0.03 μm or more and 0.18 μm or less, and more preferably 0.05 μm or more and 0.15 μm or less.

First Compound Layer

For the coated cutting tool of the present embodiment, the coating layer has a first compound layer containing a compound having the composition represented by the following formula (2), $$(Al_{1-y1}Cr_{y1})N \qquad (2)$$

[where in the formula (2), y1 represents the atomic ratio of the Cr element relative to the total atomic ratio of the Al element and the Cr element, and satisfies 0.10≤y1≤0.60].

When y1 in the composition $(Al_{1-y1}Cr_{y1})N$ represented by the formula (2) of the first compound layer is 0.1 or more, the chemical stability under high temperatures of the alternating laminate structure part is improved, which can prevent the embrittlement of the coating layer during cutting machining. This contributes to the improvement of the fracture resistance of the entire coating layer. When y1 is 0.6 or less, the high temperature hardness and the heat resistance due to containing Al are improved, and hence the wear resistance of the coated cutting tool is improved. From the same viewpoint, y1 in the composition $(Al_{1-y1}Cr_{y1})N$ represented by the formula (2) of the first compound layer is preferably 0.2 or more and 0.55 or less, and more preferably 0.3 or more and 0.5 or less.

Incidentally, for the coating layer for use in the present embodiment, x in the composition $(Al_{1-x}Cr_x)N$ represented by the formula (1) of the lowermost layer, and y1 in the composition $(Al_{1-y1}Cr_{y1})N$ represented by the formula (2) of the first compound layer take mutually different values, so that the lowermost layer and the first compound layer can be distinguished from each other.

Further, in the present embodiment, the case where the composition of each compound layer is represented as $(Al_{0.80}Cr_{0.20})N$ means that the atomic ratio of the Al element relative to the total atomic ratio of the Al element and the Cr element is 0.80, and the atomic ratio of the Cr element relative to the total atomic ratio of the Al element and the Cr element is 0.20. Namely, the case means that the amount of the Al element based on the total amount of the Al element and the Cr element is 80 at %, and the amount of the Cr element based on the total amount of the Al element and the Cr element is 20 at %.

Further, for the coated cutting tool of the present embodiment, the average thickness per layer of the first compound layer is preferably 1 nm or more and 100 nm or less. For the coated cutting tool of the present embodiment, when the average thickness per layer of the first compound layer is 1 nm or more and 100 nm or less, it is possible to provide laminated layers in a number enough to obtain the alternate lamination effect of improving both the fracture resistance and the wear resistance even if the average thickness of the entire alternating laminate structure is 1.2 µm or less. From the same viewpoint, the average thickness per layer of the first compound layer is more preferably 3 nm or more and 70 nm or less, and further preferably 5 nm or more and 50 nm or less.

Second Compound Layer

For the coated cutting tool of the present embodiment, the coating layer has a first compound layer containing a compound having the composition represented by the following formula (3),

$$(Al_{1-y2}Cr_{y2})N \quad (3)$$

[where in the formula (3), y2 represents the atomic ratio of the Cr element relative to the total atomic ratio of the Al element and the Cr element, and satisfies $0.10 \leq y1 \leq 0.60$].

When y2 in the composition $(Al_{1-y2}Cr_{y2})N$ represented by the formula (3) of the second compound layer is 0.1 or more, the chemical stability under high temperatures of the alternating laminate structure part is improved, which can prevent the embrittlement of the coating layer during cutting machining. This contributes to the improvement of the fracture resistance of the entire coating layer. When y1 is 0.6 or less, the high temperature hardness and the heat resistance due to containing Al are improved. For this reason, the wear resistance of the coated cutting tool is improved. From the same viewpoint, y2 in the composition $(Al_{1-y2}Cr_{y2})N$ represented by the formula (3) of the second compound layer is preferably 0.2 or more and 0.55 or less, and more preferably 0.3 or more and 0.5 or less.

Incidentally, in the alternating laminate structure, the first compound layer and the second compound layer are two kinds of compound layers having mutually different atomic ratios y1 and y2.

Further, for the coated cutting tool of the present embodiment, the average thickness per layer of the second compound layer is preferably 1 nm or more and 100 nm or less. For the coated cutting tool of the present embodiment, when the average thickness per layer of the second compound layer is 1 nm or more and 100 nm or less, it is possible to provide laminated layers in a number enough to obtain the alternate lamination effect of improving both the fracture resistance and the wear resistance even if the average thickness of the entire alternating laminate structure is 1.2 µm or less. From the same viewpoint, the average thickness per layer of the second compound layer is more preferably 3 nm or more and 70 nm or less, and further preferably 5 nm or more and 50 nm or less.

Alternating Laminate Structure

For the coated cutting tool of the present embodiment, the coating layer has an alternating laminate structure including a first compound layer and a second compound layer alternately laminated repeatedly twice or more therein. For the coated cutting tool of the present embodiment, the coating layer has an alternating laminate structure of AlCrN including the first compound layer and the second compound layer alternately laminated repeatedly twice or more therein. Accordingly, more excellent fracture resistance (chipping resistance) than that of the monolayered structure of AlCrN is exhibited. Although the mechanism for exhibiting such effects is not clear, the present inventors presume as follows. Generally, the coating layer is more largely damaged due to the impact during machining with an increase in thickness of the coating layer, and the scale extends to the substrate. As a result, chipping or fracture of the blade edge is caused. Therefore, by reducing the thickness itself of the coating layer serving as the starting point of the damage, it is possible to reduce the risk of the damage of the coating layer. In other words, the thinner the coating layer is, the more the chipping resistance of the coated tool is improved. However, the decrease in thickness of the coating layer results in the reduction of the wear resistance. Thus, for the coating layer for use in the present embodiment, the alternating laminate structure of AlCrN is adopted in order not to impair the chipping resistance while ensuring the thickness capable of providing a sufficient wear resistance. Inclusion of AlCrN makes it easy to provide a columnar structure throughout the alternating laminate structure. The columnar structure is more excellent in wear resistance than the particulate structure. For example, even when the average thickness of the entire coating layer is 1.3 µm or less, the wear suppressing effect by the coating layer can be sufficiently obtained. Further, in the present embodiment, the alternating laminate structure of AlCrN is adopted. As a result, it is possible to suppress the strain due to the mismatch of the crystal lattice at the layer-layer interface, and to reduce the compressive residual stress of the coating layer. As a result, conceivably, more excellent fracture resistance (chipping resistance) than that of the monolayered structure of AlCrN is exhibited. Further, for the coating layer for use in the present embodiment, conceivably, the lowermost layer and the alternating laminate structure are unified to AlCrN including the same composition type, resulting in an increase in not only the adhesive force between substrate-coating layer, but also the adhesive force between layer-layer; this can suppress the occurrence of the peeling between layers during machining. For this reason, for the coated cutting tool of the present embodiment, conceivably, in the coating layer, the lowermost layer and the alternating laminate structure are unified to AlCrN including the same composition type, so that stable machining performances can be exhibited even under such environment as to be exposed to high temperatures during strong intermittent machining of a sintered metal.

For the coated cutting tool of the present embodiment, in the alternating laminate structure, the number of repetition of the first compound layer and the second compound layer is two or more, preferably, two or more and 100 or less, and more preferably 5 or more and 95 or less.

Incidentally, in the present embodiment, when respective one layers of the first compound layer and the second compound layer are formed, "the number of repetition" is one.

Further, for the coated cutting tool of the present embodiment, the average thickness of the entire alternating laminate structure is 0.1 μm or more and 1.2 μm or less. For the coated cutting tool of the present embodiment, when the average thickness of the entire alternating laminate structure is 0.1 μm or more, the wear resistance is improved; and when the average thickness is 1.2 μm or less, the fracture resistance is improved. As a result, the coated cutting tool can withstand the strong intermittent machining strength of the sintered metal. From the same viewpoint, the average thickness of the entire alternating laminate structure is preferably 0.15 μm or more and 1.15 μm or less, and more preferably 0.19 μm or more and 1.12 μm or less.

FIG. 1 is a schematic cross sectional view showing one example of the coated cutting tool of the present embodiment. A coated cutting tool 8 comprises a substrate 1, and a coating layer 7 formed on the surface of the substrate 1. The coating layer 7 includes a lowermost layer 2, an alternating laminate structure 6 including, a first compound layer 3 and a second compound layer 4 alternately formed repeatedly twice or more, and an upper layer 5.

Compressive Residual Stress

For the coated cutting tool of the present embodiment, the coating layer comprises a crystal of a cubic system, the compressive residual stress at the cubic crystal (111) plane is 3.0 GPa or less. Incidentally, in the present embodiment, the compressive residual stress at the cubic crystal (111) plane herein is assumed to be either larger value of σ11 and σ22 when the compressive residual stresses σ11 and σ22 at the cubic crystal (111) plane described later are measured. For the coated cutting tool of the present embodiment, when the compressive residual stress at the cubic crystal (111) plane of the coating layer is 3.0 GPa or less, the adhesive force of the coating layer is improved. This can reduce the occurrence risk of the abnormal damage triggered by the strain of the stress in the coating layer. From the same viewpoint, the compressive residual stress at the cubic crystal (111) plane of the coating layer is preferably 0.0 GPa or more and 3.0 GPa or less, and more preferably 0.1 GPa or more and 3.0 GPa or less.

Further, for the coated cutting tool of the present embodiment, preferably, the coating layer comprises a crystal of a cubic system, and the compressive residual stress at the cubic crystal (220) plane is 2.0 GPa or less. For the coated cutting tool of the present embodiment, when the compressive residual stress at the cubic crystal (220) plane of the coating layer is 2.0 GPa or less, as with the case of the cubic crystal (111) plane, the peeling risk of the coating film is reduced, so that the adhesive force of the coating layer tends to be improved. Further, the coating film hardness is not increased extremely. For this reason, it is easy to control the balance between the fracture resistance and the wear resistance suitable for strong intermittent machining of a sintered metal. From the same viewpoint, the compressive residual stress at the cubic crystal (220) plane of the coating layer is more preferably 0.0 GPa or more and 2.0 GPa or less, and further preferably 0.1 GPa or more and 2.0 GPa or less.

Further, for the coated cutting tool of the present embodiment, the compressive residual stress at the cubic crystal (111) plane of the coating layer is preferably higher than the compressive residual stress at the cubic crystal (220) plane of the coating layer. For the coated cutting tool of the present embodiment, when the compressive residual stress at the cubic crystal (111) plane of the coating layer is higher than the compressive residual stress at the cubic crystal (220) plane of the coating layer, the fracture resistance is more largely improved than the wear resistance. For this reason, a suitable coating film characteristic for use in strong intermittent machining of a sintered metal tends to be obtained. Although this mechanism is not clear, it is presumed that the intense orientation of the coating layer in a cubic crystal (111) plane has an effect thereon.

Further, the coated cutting tool of the present embodiment has a rake face, a flank, and a cross ridgeline part between the rake face and the flank. The coating layer comprises a crystal of a cubic system. The absolute value |σ11−σ22| of the difference between the compressive residual stress σ11 at the cubic crystal (111) plane of the coating layer in a direction in parallel with the cross ridgeline part and the compressive residual stress σ22 at the cubic crystal (111) plane of the coating layer in a direction perpendicular to the cross ridgeline part is preferably less than 0.5 GPa.

Figure 2:
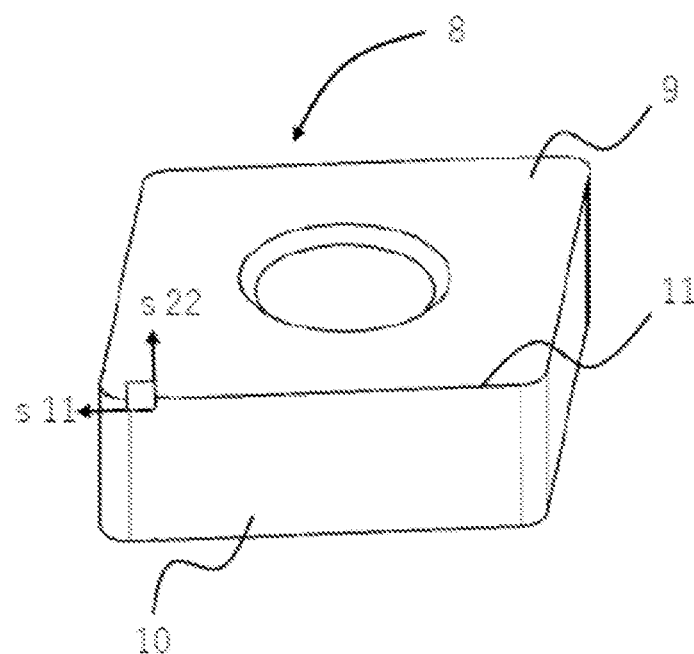
FIG. 2 is a perspective view showing a specific example of the coated cutting tool of the present invention.

FIG. 2 is a perspective view showing one specific example of the coated cutting tool of the present embodiment. In FIG. 2, a coated cutting tool 8 has a rake face 9, a flank 10, and a cross ridgeline part 11 between the rake face 9 and the flank 10. Herein, the compressive residual stress σ11 is the compressive residual stress at the cubic crystal (111) plane of the coating layer in a direction s11 in parallel with the cross ridgeline part 11, and the compressive residual stress σ22 is the compressive residual stress at the cubic crystal (111) plane of the coating layer in a direction s22 perpendicular to the cross ridgeline part 11.

For the coated cutting tool of the present embodiment, when the compressive residual stress at the cubic crystal (111) plane of the coating layer is 3.0 GPa or less, and the absolute value |σ11−σ22| of the difference between the compressive residual stress σ11 at the cubic crystal (111) plane of the coating layer in a direction in parallel with the cross ridgeline part 11, and the compressive residual stress σ22 at the cubic crystal (111) plane of the coating layer in a direction perpendicular to the cross ridgeline part 11 is less than 0.5 GPa, the anisotropy of the in-plane strain of the coating layer is reduced. This tends to enable the simultaneous improvement of the adhesive force and the fracture resistance of the coating layer. Further, for the coated cutting tool of the present embodiment, when the compressive residual stress at the cubic crystal (220) plane of the coating layer is 2.0 GPa or less, and |σ11−σ22| is less than 0.5 GPa, stable wear resistance can be expected. From the same viewpoint, the |σ11−σ22| is more preferably 0 GPa or more and 0.48 GPa or less, and further preferably 0 GPa or more and 0.45 GPa or less.

Further, for the coated cutting tool of the present embodiment, the σ11 is preferably 0.0 GPa or more and 3.0 GPa or less. For the coated cutting tool of the present embodiment, when the σ11 is 0.0 GPa or more and 3.0 GPa or less, the adhesive force of the coating layer is improved. This tends to enable more reduction of the risk of occurrence of abnormal damage triggered by the strain of the stress in the coating layer. From the same viewpoint, the σ11 is more preferably 0.05 GPa or more and 2.80 GPa or less, and further preferably 0.10 GPa or more and 2.55 GPa or less.

Further, for the coated cutting tool of the present embodiment, the σ22 is preferably 0.0 GPa or more and 3.0 GPa or less. For the coated cutting tool of the present embodiment, when the σ22 is 0.0 GPa or more and 3.0 GPa or less, the adhesive force of the coating layer is improved. This tends to enable more reduction of the risk of occurrence of abnormal damage triggered by the strain of the stress in the coating layer. From the same viewpoint, the σ22 is more preferably 0.05 GPa or more and 3.0 GPa or less, and further preferably 0.10 GPa or more and 3.0 GPa or less.

In the present embodiment, each compressive residual stress at the cubic crystal (111) plane and the cubic crystal (220) plane of the coating layer is measured using the 2D method (multi-axial stress measuring method/Full Debye ring fitting method). As the conditions for the X-ray diffraction measurement, a CuKα ray is used as the radiation source of X ray, and the conditions of output=50 kV, and 1.0 mA are set. Irradiation is performed under the conditions, thus measuring the compressive residual stress σ11 at the cubic crystal (111) plane of the coating layer in a direction in parallel with the cross ridgeline part 11, the compressive residual stress σ22 at the cubic crystal (111) plane of the coating layer in a direction perpendicular to the cross ridgeline part 11, and the compressive residual stress at the cubic crystal (220) plane of the coating layer. At this step, the compressive residual stress value is preferably measure at the coating layer of the flank at a position 0.4 mm apart from the cross ridgeline part 11. Preferably, the compressive residual stresses at given three points for each surface of the coating layer are measured by the 2D method, and the arithmetical mean value of the compressive residual stresses at the three points is determined. Specifically, the compressive residual stresses at the cubic crystal (111) plane and the cubic crystal (220) plane of the coating layer can be measured by the method shown in Examples described later.

Incidentally, in the present embodiment, the object to be measured for the compressive residual stress is the entire coating layer. When the coating layer has an upper layer described later, the upper layer is excluded from the object to be measured for the compressive residual stress. Although the method for excluding the upper layer from the object to be measured for the compressive residual stress is not particularly limited, examples thereof may include the method for excluding the upper layer by buff polishing.

X-Ray Diffraction Intensity

For the coated cutting tool of the present embodiment, the coating layer comprises a crystal of a cubic system. When the X-ray diffraction intensities at the cubic crystal (111) plane and the cubic crystal (220) plane are assumed to be I(111) and I(220), respectively, the value of I(111)/I(220) is preferably 2.5 or more. The coated cutting tool of the present embodiment tends to be able to sufficiently ensure both of the adhesive force between the substrate containing a cubic boron nitride-containing sintered body and the coating layer and the fracture resistance of the coating layer required for strong intermittent machining of a sintered metal when the value of I(111)/I(220) of the coating layer is 2.5 or more. From the same viewpoint, the value of I(111)/I(220) of the coating layer is more preferably 2.5 or more and 10.0 or less, and further preferably 2.6 or more and 7.6 or less.

The X-ray diffraction intensities at the cubic crystal (111) plane and the cubic crystal (220) plane of the coating layer can be measured using a commercially available X-ray diffraction device. For example, using a D8 DISCOVER manufactured by Bruker Co., equipped with an IμS X radiation source (Cu-Kα ray, 50 kV, 1.0 mA) including a two-dimensional detector VANTEC-500 and a converging parallel beam Montel mirror, X-ray diffraction measurement is performed under the conditions of a collimator diameter: 0.3 mm, a scan speed: 10 min/step (step width: 25°), and a 2θ measurement range: 20 to 120°. As a result, the X-ray diffraction intensity at each crystal plane can be measured. The measurement site is set at the position 0.4 mm from the blade edge ridgeline part of the coating layer of the flank.

When the X-ray diffraction intensity at each crystal plane is determined from the X-ray diffraction drawing, the analysis software included with the X-ray diffraction device may be used. With the analysis software, the Debye-Scherrer ring obtained by the measurement is converted into one dimension within the range of x=±10°. Then, using cubic expression approximation, background processing and Kα$_2$ peak removal are performed, and using the Pearson-VII function, profile fitting is performed. As a result, the X-ray diffraction intensity at each crystal plane can be determined.

Upper Layer

The coating layer for use in the present embodiment may have an upper layer opposite to the substrate of the alternating laminate structure (e.g., the upper layer of the second compound layer most distant from the substrate). The upper layer preferably contains a compound containing at least one element selected from the group consisting of Ti, Zr, Hf, V, Nb, Ta, Cr, Mo, W, Al, Si, and Y, and at least one element selected from the group consisting of C, N, O, and B. When the coated cutting tool of the present embodiment has the upper layer containing such a compound, discrimination of the use corner tends to become easy. Further, from the same viewpoint, the upper layer more preferably contains a compound containing at least one element selected from the group consisting of Ti, V, Nb, Ta, Cr, Mo, W, Al, Si, and Y, and at least one element selected from the group consisting of C, N, O, and B, preferably contains a compound containing at least one element selected from the group consisting of Ti, Nb, Ta, Cr, W, Al, Si, and Y, and at least one element selected from the group consisting of C and N, and still further preferably contains a compound containing: at least one element selected from the group consisting of Ti, Nb, Ta, Cr, W, Al, Si, and Y; and N. Although the specific compounds comprised in the upper layer is not particularly limited, examples thereof may comprise TiN, AlN, TiAlN, TiCN, TiNbN, TiWN, and TiAlCrSiN. Further, the upper layer may be a monolayer, or may be a multi-layer of two or more layers.

In the coated cutting tool of the present embodiment, the average thickness of the upper layer is preferably 0.02 μm or more and 0.3 μm or less. For the coated cutting tool of the present embodiment, when the average thickness of the upper layer is 0.02 μm or more and 0.3 μm or less, the wear resistance tends to be more excellent. From the same viewpoint, the average thickness of the upper layer is more preferably 0.03 μm or more and 0.25 μm or less, and further preferably 0.05 μm or more and 0.2 μm or less.

For the coated cutting tool of the present embodiment, the ratio of the average thickness of the upper layer occupying the average thickness of the entire coating layer is preferably 25% or less. For the coated cutting tool of the present embodiment, when the ratio of the average thickness of the upper layer occupying the average thickness of the entire coating layer coating layer is 25% or less, the effect of the alternating laminate structure tends not to be impaired. From the same viewpoint, the ratio of the average thickness of the upper layer occupying the average thickness of the entire coating layer is more preferably 5 to 25%, and further preferably 7 to 24%.

Method for Manufacturing Coated Cutting Tool

A method for manufacturing the coated cutting tool of the present embodiment will be described using a specific example. The method for manufacturing the coated cutting tool of the present embodiment is not particularly limited as long as the configuration of the coated cutting tool can be achieved.

In the coated cutting tool of the present embodiment, the substrate consisting of a cubic boron nitride-containing sintered body is not particularly limited, and can be produced by a method including, for example, the following steps (A) to (H).

Step (A): 55% by volume to 75% by volume of cubic boron nitride and 25% by volume to 45% by volume of binder phase powder (the total of these is 100% by volume) are mixed. The binder phase powder preferably contains a metal element of at least one selected from the group consisting of Ti, Zr, Hf, V, Nb, Ta, Cr, Mo, W, Al, and Co. Alternatively, the binder phase powder contains a compound of a metal element of at least one selected from the group consisting of Ti, Zr, Hf, V, Nb, Ta, Cr, Mo, W, Al, and Co, and an element of at least one selected from the group consisting of carbon, nitrogen, oxygen, and boron. Specifically, although not particularly limited, examples thereof may include $Al_2O_3$, TiN, TiC, TiCN, $TiB_2$, AlN, $AlB_2$, WC, $ZrO_2$, ZrO, ZrN, $ZrB_2$, WB, $W_2B$, CoWB, $WCo_{21}B_6$, $Co_3W_3C$, and $Co_4W_2C$. Out of these, $Al_2O_3$, AlN, and TiN are preferable.

Step (B): the raw material powder obtained in the step (A) is mixed by cemented carbide balls in a wet ball mill for 5 h to 24 h.

Step (C): the mixture obtained in the step (B) is molded into a predetermined shape to obtain a molded body.

Step (D): the molded body obtained in the step (C) is held for a predetermined time and sintered at a sintering temperature in the range of 1300° C. to 1500° C. under a pressure of 4.0 GPa to 7.0 GPa inside an ultrahigh pressure generator.

Step (E): the sintered body obtained in the step (D) is cut out according to the tool shape by an electric discharge machine.

Step (F): a substrate consisting of a cemented carbide is prepared.

Step (G): the sintered body cut out in the step (E) is joined to the substrate prepared in the step (F) by soldering or the like.

Step (H): the tool obtained in the step (G) is subjected to honing.

In order to set the average particle diameter of the particle of the cubic boron nitride in the cubic boron nitride-containing sintered body for use in the present embodiment at a desirable value, for example, it is essential only that in the process of manufacturing the substrate (e.g., the step (B)), the average particle diameter of the particle of the cubic boron nitride of the raw material is appropriately adjusted.

Method for Producing Coating Layer

A method for producing the coating layer in the coated cutting tool of the present embodiment is not particularly limited, and examples thereof include physical vapor deposition methods such as an ion plating method, an arc ion plating method, a sputtering method, an ion mixing method, and the like. It is preferable to form the coating layer by using a physical vapor deposition method because a sharp edge can be formed. Among such methods, the arc ion plating method is more preferable because more excellent adhesion between the coating layer and the substrate is obtained.

First, the substrate machined into the tool shape is accommodated in the reaction vessel of a physical vapor deposition device, and a metal evaporation source is placed in the reaction vessel. Subsequently, the inside of the reaction vessel is evacuated until the pressure in the reaction vessel becomes a vacuum of $1.0 \times 10^{-2}$ Pa or less, and the substrate is heated by a heater in the reaction vessel until the temperature thereof becomes 200° C. to 700° C. After heating, an Ar gas is introduced into the reaction vessel, so that the pressure in the reaction vessel is set at 0.5 Pa to 5.0 Pa. In an Ar gas atmosphere with a pressure of 0.5 Pa to 5.0 Pa, the substrate is applied with a bias voltage of −500 V to −350 V, and a current of 40 A to 50 A is passed through the tungsten filament in the reaction vessel. Thus, the surface of the substrate is subjected to an ion bombardment treatment by an Ar gas. After subjecting the surface of the substrate to the ion bombardment treatment, the inside of the reaction vessel is evacuated until the pressure thereof becomes a vacuum of $1.0 \times 10^{-2}$ Pa or less.

When the lowermost layer for use in the present embodiment is formed, the following procedure is desirable. The substrate is controlled so that the temperature thereof becomes 450° C. to 550° C. A nitrogen gas ($N_2$) is introduced into the reaction vessel, so that the pressure in the reaction vessel is set at 2.0 Pa to 3.0 Pa. Subsequently, the substrate is applied with a bias voltage of −60 V to −20 V, and the metal evaporation source according to the metal component (Al and Cr) of the lowermost layer is evaporated by arc discharge resulting in 140 A to 160 A, thereby forming the lowermost layer.

When the first compound layer for use in the present embodiment is formed, the following procedure is desirable. The substrate is controlled so that the temperature thereof becomes 450° C. to 550° C., and a nitrogen gas ($N_2$) is introduced into the reaction vessel, so that the pressure in the reaction vessel is set at 2.5 Pa to 3.5 Pa. Subsequently, the substrate is applied with a bias voltage of −60 V to −20 V, and the metal evaporation source according to the metal component (Al and Cr) of the first compound layer is evaporated by arc discharge resulting in 100 A to 150 A, thereby forming the first compound layer.

When the second compound layer for use in the present embodiment is formed, the substrate is controlled so that the temperature thereof becomes 450° C. to 550° C. Incidentally, when the temperature of the substrate is set at the same as the temperature of the substrate for forming the first compound layer, the first compound layer and the second compound layer can be continuously formed, and hence this is preferable. The following procedure is desirable. After controlling the temperature, a $N_2$ gas is introduced into the reaction vessel, so that the pressure in the reaction vessel is set at 2.5 Pa to 3.5 Pa. Then, the substrate is applied with a bias voltage of −60 V to −20 V, and the metal evaporation source according to the metal component (Al and Cr) of the second compound layer is evaporated by arc discharge with an arc current of 100 A to 150 A, thereby forming the second compound layer.

In order to form an alternating laminate structure of the first compound layer and the second compound layer, the following procedure is desirable. The two or more kinds of metal evaporation sources are evaporated alternately by arc discharge under the foregoing conditions, thereby alternately forming respective compound layers. By adjusting the arc discharge times of the metal evaporation sources, respectively, it is possible to control the thickness of each compound layer forming the alternating laminate structure.

In order to set the compressive residual stress at the cubic crystal (111) plane of the coating layer for use in the present embodiment at a prescribed value, it is essential only that the temperature of the substrate is adjusted, or the bias voltage is adjusted in the process of forming the coating layer. More specifically, in the process of forming the coating layer, when the temperature of the substrate is reduced, or the negative bias voltage is increased (set on the side distant from zero), the compressive residual stress at the cubic crystal (111) plane of the coating layer tends to increase.

In order to set the compressive residual stress at the cubic crystal (220) plane of the coating layer for use in the present embodiment at a prescribed value, it is essential only that the temperature of the substrate is adjusted, or the bias voltage is adjusted in the process of forming the coating layer. More specifically, when the temperature of the substrate is reduced, or the negative bias voltage is increased (set on the side distant from zero) in the process of forming the coating layer, the compressive residual stress at the cubic crystal (220) plane of the coating layer tends to increase.

In order to set the compressive residual stresses $\sigma 11$ and $\sigma 22$ at the cubic crystal (111) plane of the coating layer for use in the present embodiment at prescribed values, it is essential only that the bias voltage is adjusted, or the thickness of the coating layer is adjusted in the process of forming the coating layer. More specifically, when the negative bias voltage is increased (set on the side distant from zero) or the thickness of the coating layer is increased in the process of forming the coating layer, the compressive residual stresses $\sigma 11$ and $\sigma 22$ tend to increase. Particularly, when the negative bias voltage is increased (set on the side distant from zero) in the process of forming the coating layer, the compressive residual stresses $\sigma 11$ and $\sigma 22$ tend to remarkably increase.

In order to set the I(111)/I(220) of the coating layer for use in the present embodiment at a prescribed value, it is essential only that the temperature of the substrate is adjusted, or the pressure of the substrate is adjusted in the process of forming the coating layer. More specifically, when the temperature of the substrate is reduced, or the pressure of the substrate is reduced in the process of forming the coating layer, the I(111)/I(220) of the coating layer tends to increase.

When the upper layer for use in the present embodiment is formed, first, the substrate is heated until the temperature thereof becomes 400° C. to 450° C. After heating, a gas is introduced into a reaction vessel, and the pressure in the reaction vessel is set at 3.0 Pa to 5.0 Pa. Examples of the gas may include a $N_2$ gas when the upper layer contains a compound containing at least one element selected from the group consisting of Ti, Zr, Hf, V, Nb, Ta, Cr, Mo, W, Al, Si, and Y, and N, and may include a mixed gas of a $N_2$ gas and a $C_2H_2$ gas when the upper layer contains a compound containing at least one element selected from the group consisting of Ti, Zr, Hf, V, Nb, Ta, Cr, Mo, W, Al, Si, and Y, and N and C. The volume ratio of the mixing gas is not particularly limited, and may be, for example, $N_2$ gas:$C_2H_2$ gas=95:5 to 85:15. Then, desirably, the substrate is applied with a bias voltage of −60 V to −40 V, and the metal evaporation source according to the metal component of each layer is evaporated by arc discharge with an arc current of 100 A to 150 A, thereby forming the upper layer.

The thickness of each layer forming the coating layer in the coated cutting tool of the present embodiment can be measured from the cross sectional structure of the coated cutting tool using an optical microscope, a scanning electron microscope (SEM), a transmission electron microscope (TEM), or the like. Incidentally, the average thickness of respective layers in the coated cutting tool of the present embodiment can be determined in the following manner. The thicknesses of respective layers at three or more sites in the vicinity of the position 50 μm from the blade edge ridgeline part of the surface opposed to the metal evaporation source toward the central part of the surface are measured, and the average value (arithmetical mean value) thereof is calculated.

Further, the composition of each layer forming the coating layer in the coated cutting tool of the present embodiment can be measured from the cross sectional structure of the coated cutting tool of the present embodiment using an energy dispersive X-ray spectrometer (EDS), a wavelength dispersive X-ray spectrometer (WDS), or the like.

The coated cutting tool of the present embodiment is considered to produce the effect of being able to be more prolonged in the tool life than ever due to being excellent in at least the wear resistance and fracture resistance (provided that the factor for being able to be prolonged in the tool life is not limited the foregoing description). As the kinds of the coated cutting tool of the present embodiment, specifically, mention may be made of milling or lathe turning blade edge exchange type cutting insert, a drill, an end mill, and the like.

EXAMPLES

Hereinafter, the present invention will be described in more detail with reference to examples, but the present invention is not limited to these examples.

Example 1

As the substrate, a cubic boron nitride-containing sintered body (ISO standard: CNGA120408 insert) equivalent to H30 was manufactured using the raw materials having the compositions shown in Table 1 with the method of the following steps (1) to (8).

Step (1): at the ratios shown in Table 1, a cubic boron nitride and a powder of the binder phase were mixed (provided that the total ratio thereof was assumed to be 100 vol %).

Step (2): a raw material powder obtained in the step (1) was mixed in a wet ball mill for 12 h by using cemented carbide balls.

Step (3): the mixture obtained in the step (2) was molded into a predetermined shape to obtain a molded body.

Step (4): the molded body obtained in the step (3) was sintered inside an ultrahigh-pressure generator at a pressure of 6.0 GPa at a sintering temperature of 1300° C. for 1 h.

Step (5): the sintered body obtained in the step (4) was cut out according to the tool shape with an electric discharge machine.

Step (6): a substrate made of a cemented carbide was prepared.

Step (7): the sintered body cut out in the step (5) was joined to the substrate prepared in the step (6) by soldering.

Step (8): the tool obtained in step (7) was subjected to honing

In the reaction vessel of an arc ion plating device, a metal evaporation source was placed so as to achieve the composition of each layer shown in Table 2. The manufactured substrate was fixed to the fixing fittings of the rotary table in the reaction vessel.

Subsequently, the reaction vessel was enclosed, and the inside of the reaction vessel was evacuated until the pressure thereof became a vacuum of $5.0\times10^{-3}$ Pa or less. After evacuation, the substrate was heated by a heater in the reaction vessel until the temperature thereof became 450° C. After heating, an Ar gas was introduced into the reaction vessel so that the pressure thereof became 2.7 Pa.

In an Ar gas atmosphere with a pressure of 2.7 Pa, the substrate was applied with a bias voltage of −400 V, and a current of 40 A was passed through a tungsten filament in the reaction vessel. Thus, the surface of the substrate was subjected to an ion bombardment treatment by an Ar gas for 30 minutes. After completion of the ion bombardment treatment, the inside of the reaction vessel was evacuated until the pressure thereof became a vacuum of $5.0 \times 10^{-3}$ Pa or less.

As for the invention samples 1 to 14 and the comparative samples 1 to 6 and 8 to 12, after evacuation, the substrate was controlled so that the temperature thereof became the temperature (the temperature upon start of deposition) shown in Table 3, and a nitrogen gas ($N_2$) was introduced into the reaction vessel. Thus, the inside of the reaction vessel was adjusted to the pressure shown in Table 3. Subsequently, respective substrates were applied with their respective corresponding bias voltages shown in Table 3. Thus, the metal evaporation source of the lowermost layer of each composition shown in Table 2 was evaporated by arc discharge with each arc current shown in Table 3, thereby forming the lowermost layer on the surface of the substrate. At this step, control was performed so as to achieve each pressure in the reaction vessel shown in Table 3. Further, the thickness of the lowermost layer was controlled so as to be each thickness shown in Table 2 by adjusting each respective arc discharge time. Incidentally, for the comparative sample 7, the lowermost layer was not formed.

Then, the invention samples 1 to 14 and the comparative samples 1 to 5 and 7 to 12 were controlled so as to achieve their respective temperatures (temperatures upon start of deposition) shown in Table 3. A nitrogen gas ($N_2$) was introduced into the reaction vessel, and the inside of the reaction vessel was adjusted to each pressure shown in Table 3. Subsequently, each bias voltage shown in Table 3 was applied. Thus, the metal evaporation sources of the first compound layer and the second compound layer of each composition shown in Table 2 were alternately evaporated in this order by arc discharge with each arc current shown in Table 3. As a result, the first compound layer and the second compound layer were laminated in this order, thereby forming each alternating laminate structure on the surface of the substrate for the comparative sample 7, on the surface of the lowermost layer for the invention samples 1 to 14 and the comparative samples 1 to 5 and 8 to 12. At this step, control was performed so as to achieve each respective pressure in the reaction vessel shown in Table 3. Further, the thickness of the first compound layer and the thickness of the second compound layer were controlled so as to be their respective corresponding thicknesses shown in Table 2 by adjusting their respective corresponding arc discharge times. Incidentally, for the comparative sample 6, without forming the alternating laminate structure, a monolayer of the first compound layer with the composition shown in Table 2 was formed on the surface of the substrate under the conditions shown in Table 3.

After forming each layer on the surface of the substrate to each prescribed average thickness shown in Table 2, power supply of the heater was turned off. After the sample temperature became 100° C. or less, the sample was taken out from the inside of the reaction vessel.

TABLE 1

| | Cubic boron nitride-containing sintered body | | | | | |
|---|---|---|---|---|---|---|
| | Cubic boron nitride | | Binder phase | | | |
| | | Average particle | Al compound | | Ti compound | | Entire binder |
| Sample No. | (vol %) | diameter (μm) | Composition | (vol %) | Composition | (vol %) | phase (vol %) |
|---|---|---|---|---|---|---|---|
| Invention sample 1 | 65 | 1.0 | $Al_2O_3$, AlN | 7 | TiN | 28 | 35 |
| Invention sample 2 | 65 | 1.0 | $Al_2O_3$, AlN | 7 | TiN | 28 | 35 |
| Invention sample 3 | 65 | 1.0 | $Al_2O_3$, AlN | 7 | TiN | 28 | 35 |
| Invention sample 4 | 65 | 1.0 | $Al_2O_3$, AlN | 7 | TiN | 28 | 35 |
| Invention sample 5 | 65 | 1.0 | $Al_2O_3$, AlN | 7 | TiN | 28 | 35 |
| Invention sample 6 | 65 | 1.0 | $Al_2O_3$, AlN | 7 | TiN | 28 | 35 |
| Invention sample 7 | 65 | 1.5 | $Al_2O_3$, AlN | 7 | TiN | 28 | 35 |
| Invention sample 8 | 65 | 1.5 | $Al_2O_3$, AlN | 7 | TiN | 28 | 35 |
| Invention sample 9 | 65 | 1.5 | $Al_2O_3$, AlN | 7 | TiN | 28 | 35 |
| Invention sample 10 | 65 | 0.8 | $Al_2O_3$, AlN | 7 | TiN | 28 | 35 |
| Invention sample 11 | 65 | 0.8 | $Al_2O_3$, AlN | 7 | TiN | 28 | 35 |
| Invention sample 12 | 65 | 0.8 | $Al_2O_3$, AlN | 7 | TiN | 28 | 35 |
| Invention sample 13 | 55 | 2.0 | $Al_2O_3$, AlN | 9 | TiN | 36 | 45 |
| Invention sample 14 | 75 | 0.5 | $Al_2O_3$, AlN | 5 | TiN | 20 | 25 |
| Comparative sample 1 | 65 | 1.0 | $Al_2O_3$, AlN | 7 | TiN | 28 | 35 |
| Comparative sample 2 | 65 | 1.0 | $Al_2O_3$, AlN | 7 | TiN | 28 | 35 |
| Comparative sample 3 | 65 | 1.0 | $Al_2O_3$, AlN | 7 | TiN | 28 | 35 |
| Comparative sample 4 | 65 | 1.0 | $Al_2O_3$, AlN | 7 | TiN | 28 | 35 |
| Comparative sample 5 | 65 | 1.0 | $Al_2O_3$, AlN | 7 | TiN | 28 | 35 |
| Comparative sample 6 | 65 | 1.0 | $Al_2O_3$, AlN | 7 | TiN | 28 | 35 |
| Comparative sample 7 | 65 | 1.0 | $Al_2O_3$, AlN | 7 | TiN | 28 | 35 |
| Comparative sample 8 | 65 | 1.0 | $Al_2O_3$, AlN | 7 | TiN | 28 | 35 |
| Comparative sample 9 | 65 | 1.0 | $Al_2O_3$, AlN | 7 | TiN | 28 | 35 |
| Comparative sample 10 | 65 | 1.0 | $Al_2O_3$, AlN | 7 | TiN | 28 | 35 |
| Comparative sample 11 | 50 | 2.2 | $Al_2O_3$, AlN | 10 | TiN | 40 | 50 |
| Comparative sample 12 | 80 | 0.4 | $Al_2O_3$, AlN | 4 | TiN | 16 | 20 |

TABLE 2

| | Coating layer | | | | | | | |
|---|---|---|---|---|---|---|---|---|
| | | Alternate lamination structure | | | | | | |
| | Lowermost layer $(Al_{1-x}Cr_x)N$ | | First compound layer $(Al_{1-y1}Cr_{y1})N$ | | Second compound layer $(Al_{1-y2}Cr_{y2})N$ | | | Average thickness |
| Sample No. | Atomic ratio x | Average thickness (μm) | Atomic ratio y1 | Thickness per layer (nm) | Atomic ratio y2 | Thickness per layer (nm) | Number of repetition (time) | Average thickness (μm) | of entire coating layer (μm) |
| Invention sample 1 | 0.30 | 0.05 | 0.50 | 15 | 0.30 | 15 | 20 | 0.60 | 0.65 |
| Invention sample 2 | 0.30 | 0.10 | 0.50 | 20 | 0.30 | 20 | 30 | 1.20 | 1.30 |
| Invention sample 3 | 0.30 | 0.01 | 0.50 | 1 | 0.30 | 1 | 95 | 0.19 | 0.20 |
| Invention sample 4 | 0.30 | 0.20 | 0.50 | 5 | 0.30 | 5 | 10 | 0.10 | 0.30 |
| Invention sample 5 | 0.30 | 0.05 | 0.50 | 50 | 0.30 | 50 | 5 | 0.50 | 0.55 |
| Invention sample 6 | 0.30 | 0.05 | 0.50 | 100 | 0.30 | 100 | 5 | 1.00 | 1.05 |
| Invention sample 7 | 0.20 | 0.05 | 0.50 | 30 | 0.20 | 10 | 28 | 1.12 | 1.17 |
| Invention sample 8 | 0.40 | 0.05 | 0.50 | 30 | 0.40 | 15 | 20 | 0.90 | 0.95 |
| Invention sample 9 | 0.50 | 0.05 | 0.30 | 30 | 0.50 | 30 | 8 | 0.48 | 0.53 |
| Invention sample 10 | 0.30 | 0.05 | 0.50 | 20 | 0.10 | 5 | 30 | 0.75 | 0.80 |
| Invention sample 11 | 0.30 | 0.05 | 0.60 | 10 | 0.30 | 20 | 30 | 0.90 | 0.95 |
| Invention sample 12 | 0.30 | 0.05 | 0.10 | 5 | 0.60 | 50 | 10 | 0.55 | 0.60 |
| Invention sample 13 | 0.30 | 0.05 | 0.50 | 40 | 0.30 | 40 | 10 | 0.80 | 0.85 |
| Invention sample 14 | 0.30 | 0.05 | 0.50 | 25 | 0.30 | 25 | 17 | 0.85 | 0.90 |
| Comparative sample 1 | 0.30 | 0.05 | 0.50 | 15 | 0.30 | 15 | 45 | 1.35 | 1.40 |
| Comparative sample 2 | 0.30 | 0.05 | 0.50 | 5 | 0.30 | 10 | 5 | 0.08 | 0.13 |
| Comparative sample 3 | 0.50 | 0.30 | 0.50 | 20 | 0.30 | 30 | 15 | 0.75 | 1.05 |
| Comparative sample 4 | 0.30 | 0.005 | 0.40 | 10 | 0.60 | 15 | 20 | 0.50 | 0.51 |
| Comparative sample 5 | 0.40 | 0.15 | 0.30 | 120 | 0.40 | 150 | 5 | 1.35 | 1.50 |
| Comparative sample 6 | 0.30 | 0.10 | 0.50 | 800 | No second compound layer | | 1 | 0.80 | 0.90 |
| Comparative sample 7 | No lowermost layer | | 0.60 | 50 | 0.30 | 50 | 8 | 0.80 | 0.80 |
| Comparative sample 8 | 0.40 | 0.20 | 0.05 | 3 | 0.60 | 25 | 25 | 0.70 | 0.90 |
| Comparative sample 9 | 0.30 | 0.10 | 0.70 | 25 | 0.30 | 50 | 10 | 0.75 | 0.85 |
| Comparative sample 10 | 0.50 | 0.05 | 0.30 | 10 | 0.50 | 10 | 15 | 0.30 | 0.35 |
| Comparative sample 11 | 0.30 | 0.05 | 0.50 | 5 | 0.30 | 5 | 10 | 0.10 | 0.15 |
| Comparative sample 12 | 0.30 | 0.05 | 0.50 | 5 | 0.30 | 5 | 10 | 0.10 | 0.15 |

TABLE 3

| | Lowermost layer | | | | Alternate lamination structure (first and second compound layers) | | | |
|---|---|---|---|---|---|---|---|---|
| Sample No. | Temperature (° C.) | Voltage (V) | Current (A) | Pressure (Pa) | Temperature (° C.) | Voltage (V) | Current (A) | Pressure (Pa) |
| Invention sample 1 | 550 | −30 | 150 | 3.0 | 550 | −30 | 150 | 3.0 |
| Invention sample 2 | 550 | −30 | 150 | 3.0 | 550 | −40 | 150 | 2.5 |

TABLE 3-continued

| | Lowermost layer | | | | Alternate lamination structure (first and second compound layers) | | | |
|---|---|---|---|---|---|---|---|---|
| Sample No. | Temperature (° C.) | Voltage (V) | Current (A) | Pressure (Pa) | Temperature (° C.) | Voltage (V) | Current (A) | Pressure (Pa) |
| Invention sample 3 | 550 | −30 | 150 | 3.0 | 550 | −20 | 100 | 3.0 |
| Invention sample 4 | 550 | −30 | 150 | 3.0 | 550 | −20 | 150 | 3.0 |
| Invention sample 5 | 550 | −30 | 150 | 3.0 | 550 | −30 | 150 | 3.0 |
| Invention sample 6 | 550 | −30 | 150 | 3.0 | 550 | −30 | 150 | 3.0 |
| Invention sample 7 | 450 | −60 | 150 | 2.0 | 450 | −60 | 150 | 2.5 |
| Invention sample 8 | 550 | −40 | 150 | 3.0 | 550 | −30 | 150 | 3.0 |
| Invention sample 9 | 550 | −20 | 150 | 3.0 | 550 | −20 | 150 | 3.5 |
| Invention sample 10 | 450 | −30 | 150 | 3.0 | 450 | −30 | 100 | 3.5 |
| Invention sample 11 | 550 | −30 | 150 | 3.0 | 550 | −30 | 150 | 3.0 |
| Invention sample 12 | 450 | −30 | 150 | 3.0 | 450 | −30 | 150 | 3.5 |
| Invention sample 13 | 550 | −30 | 150 | 3.0 | 550 | −30 | 150 | 3.0 |
| Invention sample 14 | 550 | −30 | 150 | 3.0 | 550 | −30 | 150 | 3.0 |
| Comparative sample 1 | 550 | −30 | 150 | 3.0 | 550 | −30 | 150 | 3.0 |
| Comparative sample 2 | 550 | −30 | 150 | 3.0 | 550 | −20 | 150 | 3.0 |
| Comparative sample 3 | 550 | −30 | 150 | 3.0 | 550 | −30 | 150 | 3.0 |
| Comparative sample 4 | 550 | −30 | 150 | 3.0 | 550 | −30 | 150 | 3.0 |
| Comparative sample 5 | 550 | −30 | 150 | 3.0 | 550 | −30 | 150 | 3.0 |
| Comparative sample 6 | 550 | −30 | 150 | 3.0 | 550 | −30 | 150 | 4.0 |
| Comparative sample 7 | — | — | — | — | 550 | −30 | 150 | 3.0 |
| Comparative sample 8 | 550 | −30 | 150 | 3.0 | 450 | −40 | 150 | 3.5 |
| Comparative sample 9 | 550 | −30 | 150 | 3.0 | 550 | −40 | 150 | 4.0 |
| Comparative sample 10 | 550 | −30 | 150 | 3.0 | 400 | −80 | 150 | 2.5 |
| Comparative sample 11 | 550 | −30 | 150 | 3.0 | 550 | −20 | 150 | 3.0 |
| Comparative sample 12 | 550 | −30 | 150 | 3.0 | 550 | −20 | 150 | 3.0 |

For the manufactured substrate, the composition of the binder phase comprised in the cubic boron nitride-containing sintered body was identified by an X-ray diffraction device. The results are shown in Table 1. The contents (vol %) of the cubic boron nitride and the binder phase were determined by analysis by image analysis software from the structure photograph of the cubic boron nitride-containing sintered body photographed by a scanning electron microscope (SEM) in the following manner. First, the surface or a give cross section of the cubic boron nitride-containing sintered body was subjected to mirror polishing. The backscattered electron image of the polished surface of the cubic boron nitride-containing sintered body was observed using a SEM. Using a SEM, the polished surface of the cubic boron nitride-containing sintered body was observed by the backscattered electron image enlarged at a magnification of 10,000 times. Using the energy dispersive X-ray spectrometer (EDS) included with the SEM, the black region in the backscattered electron image of the polished surface was identified as a cubic boron nitride, and regions other than the black region were identified as the binder phase. Subsequently, the structure photograph was photographed using a SEM. Using image analysis software, respective areas occupied by the cubic boron nitride and the binder phase were determined from the resulting structure photograph. The values were referred to as respective contents (vol %) of the cubic boron nitride and the binder phase. The results are shown in Table 1.

The average particle diameter of the particle of the cubic boron nitride was determined by performing analysis with image analysis software from the structure photograph of the cubic boron nitride-containing sintered body photography by a SEM in the following manner. First, the surface or a given cross section of the cubic boron nitride-containing sintered body was subjected to mirror polishing. Using a SEM, the backscattered electron image of the polished surface of the cubic boron nitride-containing sintered body was observed. The structure photograph of the cubic boron nitride-containing sintered body enlarged at a magnification of 10,000 times was photographed using a SEM. The value obtained by analyzing the structure photograph of the cubic boron nitride-containing sintered body photographed according to ASTM E 112-96 using commercially available image analysis software was referred to as the particle diameter of the particle of the cubic boron nitride present in the cross sectional structure. In three visual fields, the structure photograph of the cubic boron nitride-containing sintered body was photographed. The particle diameters of the particles of the cubic boron nitride present in the cross sectional structure were determined respectively. The average value (arithmetical mean) thereof was referred to as the average particle diameter of the particle of the cubic boron nitride. The results are shown in Table 1.

The average thickness of respective layers of the resulting sample was determined in the following manner. The cross sections at three sites were TEM observed in the vicinity of the position 50 μm from the blade edge ridgeline part opposed to the metal evaporation source of the coated cutting tool toward the central part of the surface, thereby measuring the thicknesses of respective layers. The average value (arithmetical mean value) thereof was calculated. The average thickness per layer of the first compound layer was calculated as the value obtained by dividing the total thickness of the sum of the thicknesses of respective first compound layers by the number (number of repetition) of the first compound layer. The average thickness per layer of the second compound layer was also similarly calculated as the value obtained by dividing the total thickness of the sum of the thicknesses of respective second compound layers by the number (number of repetition) of the second compound layer. The results are shown in Table 2.

The composition of each layer of the resulting sample was measured at the cross section in the vicinity of the position up to 50 μm from the blade edge ridgeline part opposed to the metal evaporation source of the coated cutting tool toward the central part using an EDS included with a TEM. The results are also shown in Table 2. Incidentally, the composition ratio of the metal element of each layer of Table 2 shows the atomic ratio of each metal element relative to all the metal elements in the metal compound forming each layer.

Compressive Residual Stress

As for the resulting sample, using the 2D method (multi-axial stress measuring method/Full Debye ring fitting method), the compressive residual stresses at the cubic crystal (111) plane and the cubic crystal (220) plane of the coating layer were measured. As the conditions for the X-ray diffraction measurement, a CuKα ray was used as the radiation source of X-ray, and the condition of output: 50 kV and 1.0 mA were adopted. Irradiation was performed under the conditions, and the compressive residual stress σ11 at the cubic crystal (111) plane of the coating layer in a direction in parallel with the cross ridgeline part, the compressive residual stress σ22 at the cubic crystal (111) plane of the coating layer in a direction perpendicular to the cross ridgeline part, and the compressive residual stress at the cubic crystal (220) plane of the coating layer were measured. At this step, the compressive residual stress value was measured for the coating layer of the flank at a position 0.4 mm apart from the cross ridgeline part. The compressive residual stress values at given three points were measured for each surface of the coating layer with the 2D method, thereby determining the arithmetical mean value of the compressive residual stresses at the three points. Further, the absolute value |σ11−σ22| of the difference between the σ11 and the σ22 was determined from the resulting measurement results. The measurement results are shown in Table 4. Incidentally, in the present example, the compressive residual stress at the cubic crystal (111) plane of the entire coating layer was assumed to be either larger value of the σ11 and the σ22.

I(111)/I(220)

As for the resulting sample, the X-ray diffraction intensities at the cubic crystal (111) plane and the cubic crystal (220) plane of the coating layer were measured using a D8 DISCOVER manufactured by Bruker Co., equipped with an IμS X radiation source (Cu-Kα ray, 50 kV, 1.0 mA) including a two-dimensional detector VÅNTEC-500 and a converging parallel beam Montel mirror. Specifically, X-ray diffraction measurement was performed under the conditions of a collimator diameter: 0.3 mm, a scan speed: 10 min/step (step width: 25°), and a 2θ measurement range: 20 to 120°, thereby measuring the X-ray diffraction intensity at each crystal plane. The measurement site was set at the position 0.4 mm from the blade edge ridgeline part of the coating layer of the flank. When the X-ray diffraction intensity at each crystal plane was determined from the X-ray diffraction drawing, the analysis software included with the X-ray diffraction device was used. With the analysis software, the Debye-Scherrer ring obtained by the measurement was converted into one dimension within the range of x=±10°. Then, using cubic expression approximation, background processing and Kα$_2$ peak removal were performed, and using the Pearson-VII function, profile fitting was performed. As a result, the X-ray diffraction intensity at each crystal plane was determined. The value of I(111)/I(220) was determined where I(111) and I(220) represent the X-ray diffraction intensities at the cubic crystal (111) plane and the cubic crystal (220) plane of the coating layer, respectively. The results are shown in Table 4.

TABLE 4

| | Compressive residual stress of coating layer | | | | |
|---|---|---|---|---|---|
| | Compressive residual stress at (111) plane | | | Compressive residual stress | |
| Sample No. | σ11 (GPa) | σ22 (GPa) | \|σ11-σ22\| (GPa) | at (220) plane (GPa) | I(111)/ I(220) |
| Invention sample 1 | 2.00 | 2.00 | 0.00 | 1.3 | 6.5 |
| Invention sample 2 | 2.10 | 2.40 | 0.30 | 1.5 | 7.6 |
| Invention sample 3 | 0.10 | 0.20 | 0.10 | 0.1 | 3.5 |
| Invention sample 4 | 0.35 | 0.10 | 0.25 | 0.1 | 3.9 |
| Invention sample 5 | 1.10 | 0.80 | 0.30 | 0.3 | 4.6 |
| Invention sample 6 | 0.90 | 0.50 | 0.40 | 0.2 | 4.8 |
| Invention sample 7 | 2.55 | 3.00 | 0.45 | 2.0 | 7.0 |
| Invention sample 8 | 2.00 | 1.80 | 0.20 | 0.7 | 3.2 |
| Invention sample 9 | 1.30 | 1.20 | 0.10 | 0.4 | 2.5 |
| Invention sample 10 | 1.15 | 1.50 | 0.35 | 0.4 | 2.8 |
| Invention sample 11 | 1.40 | 1.20 | 0.20 | 0.3 | 4.0 |
| Invention sample 12 | 1.55 | 1.20 | 0.35 | 0.3 | 2.6 |
| Invention sample 13 | 2.00 | 1.70 | 0.30 | 0.6 | 6.2 |

TABLE 4-continued

| | Compressive residual stress of coating layer | | | | |
|---|---|---|---|---|---|
| | Compressive residual stress at (111) plane | | | Compressive residual stress | |
| Sample No. | σ11 (GPa) | σ22 (GPa) | \|σ11-σ22\| (GPa) | at (220) plane (GPa) | I(111)/ I(220) |
| Invention sample 14 | 1.60 | 1.40 | 0.20 | 0.3 | 5.8 |
| Comparative sample 1 | 1.80 | 1.50 | 0.30 | 0.8 | 7.5 |
| Comparative sample 2 | 0.30 | 0.40 | 0.10 | 0.1 | 6.3 |
| Comparative sample 3 | 1.30 | 1.20 | 0.10 | 0.4 | 6.0 |
| Comparative sample 4 | 1.60 | 1.30 | 0.30 | 0.4 | 4.8 |
| Comparative sample 5 | 1.95 | 1.50 | 0.45 | 0.6 | 3.0 |
| Comparative sample 6 | 1.65 | 1.60 | 0.05 | 0.5 | 2.2 |
| Comparative sample 7 | 1.20 | 1.00 | 0.20 | 0.3 | 4.5 |
| Comparative sample 8 | 2.90 | 2.50 | 0.40 | 1.7 | 2.7 |
| Comparative sample 9 | 1.40 | 1.10 | 0.30 | 0.2 | 2.3 |
| Comparative sample 10 | 4.50 | 3.80 | 0.70 | 3.0 | 6.0 |
| Comparative sample 11 | 0.60 | 0.50 | 0.10 | 0.1 | 3.0 |
| Comparative sample 12 | 0.60 | 0.60 | 0.00 | 0.1 | 3.3 |

Using the resulting samples, the following cutting test was performed, thereby performing evaluation.

Cutting Test

Work material: SCM415H (60 HRC)

Work material shape: disk with a diameter of 110 mm×20 mm (including 20 holes each with a diameter of 6 mm)

Cutting speed: 100 m/min

Depth of cut: 0.20 mm

Feed: 0.10 mm/rev

Coolant: water soluble

Evaluation item: the machining time to the tool life was measured where the tool life represents the time when a sample has been broken (fracture has been caused in the cutting blade part of the sample), or the time when the flank wear width has reached 0.15 mm. A long machining time means the tool being excellent in fracture resistance and wear resistance. The resulting evaluation results are shown in Table 5.

TABLE 5

| Sample No. | Cutting test Machining time (min) |
|---|---|
| Invention sample 1 | 40 |
| Invention sample 2 | 35 |
| Invention sample 3 | 28 |
| Invention sample 4 | 31 |
| Invention sample 5 | 37 |
| Invention sample 6 | 35 |
| Invention sample 7 | 35 |
| Invention sample 8 | 36 |
| Invention sample 9 | 33 |
| Invention sample 10 | 30 |
| Invention sample 11 | 32 |
| Invention sample 12 | 28 |
| Invention sample 13 | 31 |
| Invention sample 14 | 28 |
| Comparative sample 1 | 8 |
| Comparative sample 2 | 15 |
| Comparative sample 3 | 20 |
| Comparative sample 4 | 17 |
| Comparative sample 5 | 5 |
| Comparative sample 6 | 18 |
| Comparative sample 7 | 15 |
| Comparative sample 8 | 11 |
| Comparative sample 9 | 15 |
| Comparative sample 10 | 12 |
| Comparative sample 11 | 5 |
| Comparative sample 12 | 15 |

The results shown in Table 5 indicate that the machining time of the invention sample was 28 minutes or more, and was longer than the machining times of all the comparative samples.

The results up to this point indicate that the improvement of the wear resistance and the fracture resistance resulted in a longer tool life of the invention sample.

Example 2

Using the raw material with each composition shown in Table 6 as the substrate, with the method of the following steps (1) to (8), a cubic boron nitride-containing sintered body (ISO standard: CNGA120408 insert) equivalent to H30 was manufactured.

Step (1): a cubic boron nitride, and a powder of the binder phase were mixed at the ratios shown in Table 6 (provided that the total ratio thereof was assumed to be 100 vol %).

Step (2): a raw material powder obtained in the step (1) was mixed in a wet ball mill for 12 h by using cemented carbide balls.

Step (3): the mixture obtained in the step (2) was molded into a predetermined shape to obtain a molded body.

Step (4): the molded body obtained in the step (3) was sintered inside an ultrahigh-pressure generator at a pressure of 6.0 GPa at a sintering temperature of 1300° C. for 1 h.

Step (5): the sintered body obtained in the step (4) was cut out according to the tool shape with an electric discharge machine.

Step (6): a substrate made of a cemented carbide was prepared.

Step (7): the sintered body cut out in the step (5) was joined to the substrate prepared in the step (6) by soldering.

Step (8): the tool obtained in step (7) was subjected to honing.

In the reaction vessel of an arc ion plating device, a metal evaporation source was placed so as to achieve the composition of each layer shown in Table 7. The manufactured substrate was fixed to the fixing fittings of a rotary table in the reaction vessel.

Subsequently, the reaction vessel was enclosed, and the inside of the reaction vessel was evacuated until the pressure thereof became a vacuum of $5.0 \times 10^{-3}$ Pa or less. After evacuation, the substrate was heated by a heater in the reaction vessel until the temperature thereof became 450° C. After heating, an Ar gas was introduced into the reaction vessel so that the pressure thereof became 2.7 Pa.

In an Ar gas atmosphere with a pressure of 2.7 Pa, the substrate was applied with a bias voltage of −400 V, and a current of 40 A was passed through the tungsten filament in the reaction vessel, thereby subjecting the surface of the substrate to an ion bombardment treatment with an Ar gas for 30 minutes. After the completion of the ion bombardment treatment, the inside of the reaction vessel was evacuated until the pressure thereof became a vacuum of $5.0 \times 10^{-3}$ Pa or less.

In the same manner as with the invention sample 1 for the invention samples 15 to 17, in the same manner as with the invention sample 6 for the invention samples 18 to 20, and in the same manner as with the invention sample 13 for the invention samples 21 to 23, the lowermost layer was formed on the surface of the substrate, and the first compound layer and the second compound layer were formed alternately in this order on the surface of the lowermost layer, thereby forming an alternating laminate structure.

Then, for the invention samples 15 to 23, control was performed so as to achieve each temperature (the temperature upon start of deposition) shown in Table 8. A nitrogen gas ($N_2$), or a mixed gas of a nitrogen gas ($N_2$) and an acetylene ($C_2H_2$) gas was introduced into the reaction vessel, and the inside of the reaction vessel was adjusted to each pressure shown in Table 8. Subsequently, each bias voltage shown in Table 8 was applied, and the metal evaporation source of the upper layer with each composition shown in Table 8 was evaporated by arc discharge with each arc current shown in Table 8, thereby forming the upper layer on the surface of the alternating laminate structure. At this step, control was performed so as to achieve each pressure in the reaction vessel shown in Table 8. Further, the thickness of the upper layer was controlled by adjusting each respective arc discharge time so as to achieve each thickness shown in Table 8.

After forming each layer to each prescribed average thickness shown in Table 8 on the surface of the substrate, the power supply of the heater was turned off. After the sample temperature became 100° C. or less, the sample was taken out from the inside of the reaction vessel.

TABLE 6

| | Cubic boron nitride-containing sintered body | | | | | |
|---|---|---|---|---|---|---|
| | Cubic boron nitride | | Binder phase | | | |
| | | Average particle | Al compound | | Ti compound | | Entire binder |
| Sample No. | (vol %) | diameter (μm) | Composition | (vol %) | Composition | (vol %) | phase (vol %) |
| Invention sample 15 | 65 | 1.0 | $Al_2O_3$, AlN | 7 | TiN | 28 | 35 |
| Invention sample 16 | 65 | 1.0 | $Al_2O_3$, AlN | 7 | TiN | 28 | 35 |
| Invention sample 17 | 65 | 1.0 | $Al_2O_3$, AlN | 7 | TiN | 28 | 35 |
| Invention sample 18 | 65 | 1.0 | $Al_2O_3$, AlN | 7 | TiN | 28 | 35 |
| Invention sample 19 | 65 | 1.0 | $Al_2O_3$, AlN | 7 | TiN | 28 | 35 |
| Invention sample 20 | 65 | 1.0 | $Al_2O_3$, AlN | 7 | TiN | 28 | 35 |
| Invention sample 21 | 55 | 2.0 | $Al_2O_3$, AlN | 9 | TiN | 36 | 45 |
| Invention sample 22 | 55 | 2.0 | $Al_2O_3$, AlN | 9 | TiN | 36 | 45 |
| Invention sample 23 | 55 | 2.0 | $Al_2O_3$, AlN | 9 | TiN | 36 | 45 |

TABLE 7

| | Coating layer | | | | | |
|---|---|---|---|---|---|---|
| | Lowermost layer and alternating laminate structure | | Upper layer | | | |
| Sample No. | Composition and thickness | Total average thickness (μm) | Composition | Average thickness (μm) | Ratio occupying average thickness of entire coating layer (%) | Average thickness of entire coating layer (μm) |
| Invention sample 15 | The same as those of Invention sample 1 | 0.65 | TiN | 0.10 | 13 | 0.75 |
| Invention sample 16 | The same as those of Invention sample 1 | 0.65 | $(Ti_{0.50}Al_{0.50})N$ | 0.05 | 7 | 0.70 |
| Invention sample 17 | The same as those of Invention sample 1 | 0.65 | $(Ti_{0.50}Al_{0.30}Cr_{0.15}Si_{0.50})N$ | 0.20 | 24 | 0.85 |
| Invention sample 18 | The same as those of Invention sample 6 | 1.05 | AlN | 0.10 | 9 | 1.15 |
| Invention sample 19 | The same as those of Invention sample 6 | 1.05 | TiCN | 0.10 | 9 | 1.15 |
| Invention sample 20 | The same as those of Invention sample 6 | 1.05 | $(Ti_{0.80}Nb_{0.20})N$ | 0.10 | 9 | 1.15 |

TABLE 7-continued

| | Coating layer | | | | | |
|---|---|---|---|---|---|---|
| | Lowermost layer and alternating laminate structure | | Upper layer | | | |
| Sample No. | Composition and thickness | Total average thickness (μm) | Composition | Average thickness (μm) | Ratio occupying average thickness of entire coating layer (%) | Average thickness of entire coating layer (μm) |
| Invention sample 21 | The same as those of Invention sample 13 | 0.85 | $(Ti_{0.90}W_{0.10})N$ | 0.15 | 15 | 1.00 |
| Invention sample 22 | The same as those of Invention sample 13 | 0.85 | $(Ti_{0.50}Al_{0.50})N$ | 0.15 | 15 | 1.00 |
| Invention sample 23 | The same as those of Invention sample 13 | 0.85 | TiN | 0.15 | 15 | 1.00 |

TABLE 8

| | Lowermost layer and Alternate lamination structure | Upper layer | | | |
|---|---|---|---|---|---|
| Sample No. | | Temperature (°C.) | Pressure (Pa) | Bias voltage (V) | Current (A) |
| Invention sample 15 | The same as those of Invention sample 1 | 450 | 3 | −60 | 120 |
| Invention sample 16 | The same as those of Invention sample 1 | 450 | 3 | −60 | 120 |
| Invention sample 17 | The same as those of Invention sample 1 | 450 | 3 | −60 | 120 |
| Invention sample 18 | The same as those of Invention sample 6 | 450 | 3 | −40 | 120 |
| Invention sample 19 | The same as those of Invention sample 6 | 450 | 4 | −40 | 120 |
| Invention sample 20 | The same as those of Invention sample 6 | 400 | 4 | −40 | 120 |
| Invention sample 21 | The same as those of Invention sample 13 | 400 | 4 | −60 | 120 |
| Invention sample 22 | The same as those of Invention sample 13 | 400 | 4 | −60 | 120 |
| Invention sample 23 | The same as those of Invention sample 13 | 400 | 5 | −60 | 120 |

In the manufactured substrate, the composition of the binder phase comprised in the cubic boron nitride-containing sintered body was identified by an X-ray diffraction device. The results are shown in Table 6. The contents (vol %) of the cubic boron nitride and the binder phase, and the average particle diameter of the cubic boron nitride were determined in the same manner as in Example 1. The results are shown in Table 6.

The average thickness of respective layers of the resulting sample was calculated in the same manner as in Example 1. The results are shown in Table 7. Further, the composition of each layer of the resulting sample was measured in the same manner as in Example 1. The results are also shown in Table 7. Incidentally, the composition ratio of the metal element of each layer of Table 7 represents the atomic ratio of each metal element relative to the total atomic ratio of all the metal elements in the metal compound forming each layer.

Compressive Residual Stress

As for the resulting sample, in the same manner as in Example 1, the compressive residual stress σ11 at the cubic crystal (111) plane of the coating layer in a direction in parallel with the cross ridgeline part, the compressive residual stress σ22 at the cubic crystal (111) plane of the coating layer in a direction perpendicular to the cross ridgeline part, and the compressive residual stress at the cubic crystal (220) plane of the coating layer were measured. Further, the absolute value |σ11−σ22| of the difference between the σ11 and the σ22 was determined from the obtained measurement results. The measurement results are shown in Table 9.

I(111)/I(220)

As for the resulting sample, in the same manner as in Example 1, the X-ray diffraction intensities at the cubic crystal (111) plane and the cubic crystal (220) plane of the coating layer were measured, thereby determining the value of I(111)/I(220). The results are shown in Table 9.

TABLE 9

| | Compressive residual stress of coating layer | | | | |
|---|---|---|---|---|---|
| | Compressive residual stress at (111) plane | | | Compressive residual stress | |
| Sample No. | σ11 (GPa) | σ22 (GPa) | |σ11−σ22| (GPa) | at (220) plane (GPa) | I(111)/ I(220) |
| Invention sample 15 | 2.00 | 2.00 | 0.00 | 1.3 | 6.5 |
| Invention sample 16 | 2.00 | 2.00 | 0.00 | 1.3 | 6.5 |
| Invention sample 17 | 2.00 | 2.00 | 0.00 | 1.3 | 6.5 |
| Invention sample 18 | 0.90 | 0.50 | 0.40 | 0.2 | 4.8 |
| Invention sample 19 | 0.90 | 0.50 | 0.40 | 0.2 | 4.8 |
| Invention sample 20 | 0.90 | 0.50 | 0.40 | 0.2 | 4.8 |
| Invention sample 21 | 2.00 | 1.70 | 0.30 | 0.6 | 6.2 |
| Invention sample 22 | 2.00 | 1.70 | 0.30 | 0.6 | 6.2 |
| Invention sample 23 | 2.00 | 1.70 | 0.30 | 0.6 | 6.2 |

Using the resulting sample, the following cutting test was performed, and evaluation was performed.
Cutting Test
Work material: SCM415H (60 HRC)
Work material shape: disk with a diameter of 110 mm×20 mm (20 holes each with a diameter of 6 mm in the end face)

Cutting speed: 100 m/min
Depth of cut: 0.20 mm
Feed: 0.10 mm/rev
Coolant: water soluble
Evaluation item: the machining time to the tool life was measured where the tool life represents the time when a sample has been broken (fracture has been caused in the cutting blade part of the sample), or the time when the flank wear width has reached 0.15 mm. A long machining time means the tool being excellent in fracture resistance and wear resistance. The resulting evaluation results are shown in Table 10.

TABLE 10

| Sample No. | Cutting test Tool life (min) |
|---|---|
| Invention sample 15 | 43 |
| Invention sample 16 | 41 |
| Invention sample 17 | 42 |
| Invention sample 18 | 36 |
| Invention sample 19 | 37 |
| Invention sample 20 | 36 |
| Invention sample 21 | 32 |
| Invention sample 22 | 32 |
| Invention sample 23 | 33 |

From the results shown in Table 10, the machining time of the invention sample was 32 minutes or more, and was longer than the machining times of all the comparative samples.

The results up to this point indicate that the improvement of the wear resistance and the fracture resistance resulted in a longer tool life of the invention sample.

INDUSTRIAL APPLICABILITY

The coated cutting tool of the present invention is excellent in wear resistance and fracture resistance, and accordingly can be prolonged in tool life than ever. For this reason, the industrial availability thereof is high in this respect.

REFERENCE SIGNS LIST

1: Substrate, 2: Lowermost layer, 3: First compound layer, 4: Second compound layer, 5: Upper layer, 6: Alternating laminate structure, 7: Coating layer, 8: Coated cutting tool, 9: Rake face, 10: Flank, 11: Cross ridgeline part, s11: Direction in parallel with the cross ridgeline part 11, s22: Direction perpendicular to the cross ridgeline part 11.

What is claimed is:

1. A coated cutting tool comprising a substrate containing a cubic boron nitride-containing sintered body, and a coating layer formed on the substrate,
wherein the coating layer comprises a lowermost layer and an alternating laminate structure in this order from the substrate side toward a surface side of the coating layer,
the lowermost layer contains a compound having a composition represented by the following formula (1), $$(Al_{1-x}Cr_x)N \tag{1}$$

[where in the formula (1), x represents an atomic ratio of a Cr element relative to a total ratio of an Al element and the Cr element, and satisfies 0.20≤x≤0.50],
an average thickness of the lowermost layer is 0.01 μm or more and 0.2 μm or less,
the alternating laminate structure is an alternating laminate structure including a first compound layer containing a compound having a composition represented by the following formula (2) and a second compound layer containing a compound having a composition represented by the following formula (3) alternately laminated repeatedly twice or more, $$(Al_{1-y1}Cr_{y1})N \tag{2}$$

[where in the formula (2), y1 represents an atomic ratio of a Cr element relative to a total ratio of an Al element and the Cr element, and satisfies 0.10≤y1≤0.60], $$(Al_{1-y2}Cr_{y2})N \tag{3}$$

[where in the formula (3), y2 represents an atomic ratio of a Cr element relative to a total ratio of an Al element and the Cr element, and satisfies 0.10≤y2≤0.60],
in the alternating laminate structure, the first compound layer and the second compound layer are two kinds of compound layers having mutually different atomic ratios y1 and y2,
an average thickness of the entire alternating laminate structure is 0.1 μm or more and 1.2 μm or less,
an average thickness of the entire coating layer is 0.2 μm or more and 1.3 μm or less, and
the coating layer comprises a crystal of a cubic system, and a compressive residual stress at the cubic crystal (111) plane is 3.0 GPa or less.

2. The coated cutting tool according to claim 1, wherein an average thickness per layer of the first compound layer is 1 nm or more and 100 nm or less, and
an average thickness per layer of the second compound layer is 1 nm or more and 100 nm or less.

3. The coated cutting tool according to claim 1, wherein the coating layer comprises a crystal of a cubic system, and a compressive residual stress at the cubic crystal (220) plane is 2.0 GPa or less.

4. The coated cutting tool according to claim 1, wherein the coated cutting tool comprises a rake face, a flank, and a cross ridgeline part between the rake face and the flank, and
the coating layer comprises a crystal of a cubic system, and an absolute value |σ11−σ22| of a difference between a compressive residual stress σ11 at a cubic crystal (111) plane of the coating layer in a direction in parallel with the cross ridgeline part and a compressive residual stress σ22 at a cubic crystal (111) plane of the coating layer in a direction perpendicular to the cross ridgeline part is less than 0.5 GPa.

5. The coated cutting tool according to claim 4, wherein the σ11 is 0.0 GPa or more and 3.0 GPa or less.

6. The coated cutting tool according to claim 4, wherein the σ22 is 0.0 GPa or more and 3.0 GPa or less.

7. The coated cutting tool according to claim 1, wherein the coating layer comprises a crystal of a cubic system, and a value of I(111)/I(220) is 2.5 or more where I(111) and I(220) represent X-ray diffraction intensities at the cubic crystal (111) plane and the cubic crystal (220) plane, respectively.

8. The coated cutting tool according to claim 1,
wherein the coating layer has an upper layer on a surface opposite to the substrate of the alternating laminate structure,
the upper layer contains a compound containing at least one element selected from the group consisting of Ti, Zr, Hf, V, Nb, Ta, Cr, Mo, W, Al, Si, and Y, and at least one element selected from the group consisting of C, N, O, and B, an average thickness of the upper layer is 0.02 µm or more and 0.3 µm or less, and a ratio of an average thickness of the upper layer occupying an average thickness of the entire coating layer is 25% or less.

9. The coated cutting tool according to claim 1, wherein the cubic boron nitride-containing sintered body comprises a cubic boron nitride in an amount of 55 vol % or more and 75 vol % or less, and a binder phase in an amount of 25 vol % or more and 45 vol % or less, for every 100 vol % of the total amount, and the cubic boron nitride is a particle, and an average particle diameter of the particle is 0.5 µm or more and 2.0 µm or less.

10. The coated cutting tool according to claim 2, wherein the coating layer comprises a crystal of a cubic system, and a compressive residual stress at the cubic crystal (220) plane is 2.0 GPa or less.

11. The coated cutting tool according to claim 5, wherein the $\sigma 22$ is 0.0 GPa or more and 3.0 GPa or less.

12. The coated cutting tool according to claim 2, wherein the coating layer comprises a crystal of a cubic system, and a value of I(111)/I(220) is 2.5 or more where I(111) and I(220) represent X-ray diffraction intensities at the cubic crystal (111) plane and the cubic crystal (220) plane, respectively.

13. The coated cutting tool according to claim 3, wherein the coating layer comprises a crystal of a cubic system, and a value of I(111)/I(220) is 2.5 or more where I(111) and I(220) represent X-ray diffraction intensities at the cubic crystal (111) plane and the cubic crystal (220) plane, respectively.

14. The coated cutting tool according to claim 4, wherein the coating layer comprises a crystal of a cubic system, and a value of I(111)/I(220) is 2.5 or more where I(111) and I(220) represent X-ray diffraction intensities at the cubic crystal (111) plane and the cubic crystal (220) plane, respectively.

15. The coated cutting tool according to claim 10, wherein the coating layer comprises a crystal of a cubic system, and a value of I(111)/I(220) is 2.5 or more where I(111) and I(220) represent X-ray diffraction intensities at the cubic crystal (111) plane and the cubic crystal (220) plane, respectively.

16. The coated cutting tool according to claim 11, wherein the coating layer comprises a crystal of a cubic system, and a value of I(111)/I(220) is 2.5 or more where I(111) and I(220) represent X-ray diffraction intensities at the cubic crystal (111) plane and the cubic crystal (220) plane, respectively.

17. The coated cutting tool according to claim 2, wherein the coating layer has an upper layer on a surface opposite to the substrate of the alternating laminate structure, the upper layer contains a compound containing at least one element selected from the group consisting of Ti, Zr, Hf, V, Nb, Ta, Cr, Mo, W, Al, Si, and Y, and at least one element selected from the group consisting of C, N, O, and B, an average thickness of the upper layer is 0.02 µm or more and 0.3 µm or less, and a ratio of an average thickness of the upper layer occupying an average thickness of the entire coating layer is 25% or less.

18. The coated cutting tool according to claim 3, wherein the coating layer has an upper layer on a surface opposite to the substrate of the alternating laminate structure, the upper layer contains a compound containing at least one element selected from the group consisting of Ti, Zr, Hf, V, Nb, Ta, Cr, Mo, W, Al, Si, and Y, and at least one element selected from the group consisting of C, N, O, and B, an average thickness of the upper layer is 0.02 µm or more and 0.3 µm or less, and a ratio of an average thickness of the upper layer occupying an average thickness of the entire coating layer is 25% or less.

19. The coated cutting tool according to claim 10, wherein the coated cutting tool comprises a rake face, a flank, and a cross ridgeline part between the rake face and the flank, and the coating layer comprises a crystal of a cubic system, and an absolute value $|\sigma 11 - \sigma 22|$ of a difference between a compressive residual stress $\sigma 11$ at a cubic crystal (111) plane of the coating layer in a direction in parallel with the cross ridgeline part and a compressive residual stress $\sigma 22$ at a cubic crystal (111) plane of the coating layer in a direction perpendicular to the cross ridgeline part is less than 0.5 GPa.

20. The coated cutting tool according to claim 19, wherein the coating layer comprises a crystal of a cubic system, and a value of I(111)/I(220) is 2.5 or more where I(111) and I(220) represent X-ray diffraction intensities at the cubic crystal (111) plane and the cubic crystal (220) plane, respectively.

\* \* \* \* \*